(12) United States Patent
Ting et al.

(10) Patent No.: US 11,784,482 B2
(45) Date of Patent: Oct. 10, 2023

(54) ELECTRICAL CONNECTION MONITORING USING CABLE SHIELDING

(71) Applicants: Guan Che Ting, San Jose, CA (US); Seanpatrick D. O'Hern, Santa Clara, CA (US); Venus K. Garg, Pleasanton, CA (US); Andrew J. McDowell, Menlo Park, CA (US); Matteo Telli, Pleasanton, CA (US)

(72) Inventors: Guan Che Ting, San Jose, CA (US); Seanpatrick D. O'Hern, Santa Clara, CA (US); Venus K. Garg, Pleasanton, CA (US); Andrew J. McDowell, Menlo Park, CA (US); Matteo Telli, Pleasanton, CA (US)

(73) Assignee: APPLE INC., Cupertino, CA (US)

( * ) Notice: Subject to any disclaimer, the term of this patent is extended or adjusted under 35 U.S.C. 154(b) by 179 days.

(21) Appl. No.: 17/075,231

(22) Filed: Oct. 20, 2020

(65) Prior Publication Data

US 2022/0123542 A1    Apr. 21, 2022

(51) Int. Cl.
*H02H 1/00*    (2006.01)
*G01R 31/54*    (2020.01)
(Continued)

(52) U.S. Cl.
CPC ....... *H02H 1/0007* (2013.01); *B60R 16/0215* (2013.01); *B60R 16/03* (2013.01);
(Continued)

(58) Field of Classification Search
None
See application file for complete search history.

(56) References Cited

U.S. PATENT DOCUMENTS

| 3,639,674 A | * | 2/1972 | Stier | H01B 11/18 |
| | | | | 174/102 R |
| 3,673,307 A | * | 6/1972 | Eager, Jr. | H01B 7/1855 |
| | | | | 428/592 |

(Continued)

FOREIGN PATENT DOCUMENTS

| CN | 101138139 A | * | 3/2008 | H01H 83/02 |
| CN | 102185230 A | * | 9/2011 | G02B 6/4416 |

(Continued)

OTHER PUBLICATIONS

Aptiv Product, "Inner Connector 4 Way (M+F) Orange", Connection Systems Catalog, Part #15526394, https://ecat.aptiv.com/product/15526394, Downloaded Oct. 20, 2020 (2 pp).

(Continued)

*Primary Examiner* — Timothy J. Dole
*Assistant Examiner* — Muhammed Azam
(74) *Attorney, Agent, or Firm* — Young Basile Hanlon & MacFarlane, P.C.

(57) ABSTRACT

Systems and methods for electrical connection monitoring using cable shielding are described. For example, a system may include a high-voltage power supply; a first high-voltage cable including a first conductor connected to the high-voltage power supply and a first shielding that encircles the first conductor; a second high-voltage cable including a second conductor connected to the high-voltage power supply and a second shielding that encircles the second conductor; and a continuity detection circuit connected to the first shielding and to the second shielding, wherein the second shielding is connected to the first shielding to form a loop with the continuity detection circuit.

19 Claims, 10 Drawing Sheets

(51) Int. Cl.
  *B60R 16/02* (2006.01)
  *B60R 16/03* (2006.01)
  *G01R 31/00* (2006.01)
  *H02H 7/22* (2006.01)
  *H01B 9/02* (2006.01)
(52) U.S. Cl.
  CPC ........... *G01R 31/006* (2013.01); *G01R 31/54* (2020.01); *H02H 7/228* (2013.01); *H01B 9/028* (2013.01)

(56) References Cited

U.S. PATENT DOCUMENTS

| | | | | |
|---|---|---|---|---|
| 3,792,350 | A * | 2/1974 | Bossier | G01R 31/58 324/530 |
| 3,816,644 | A * | 6/1974 | Giffel | H01B 9/028 174/115 |
| 3,898,561 | A * | 8/1975 | Leighton, Sr. | G01R 31/006 324/416 |
| 3,911,357 | A * | 10/1975 | Adam | H05B 3/84 324/505 |
| 3,936,744 | A * | 2/1976 | Perlmutter | G01R 31/006 324/416 |
| 3,996,511 | A * | 12/1976 | Baer | G01R 1/06788 324/556 |
| 4,335,348 | A * | 6/1982 | Reed | G01R 31/58 324/529 |
| 4,524,321 | A * | 6/1985 | Jablway | G01R 31/54 324/540 |
| 4,947,110 | A * | 8/1990 | Laass | G01R 31/54 379/22.03 |
| 5,030,916 | A * | 7/1991 | Bokitch | G01R 31/006 324/133 |
| 5,280,251 | A * | 1/1994 | Strangio | G01R 31/58 324/133 |
| 5,312,401 | A * | 5/1994 | Newton | A61B 18/14 606/42 |
| 6,225,810 | B1 * | 5/2001 | Godo | G01R 31/58 324/529 |
| 7,422,589 | B2 * | 9/2008 | Newton | A61B 18/1233 606/46 |
| 7,586,722 | B2 * | 9/2009 | Scholer | B60L 3/0092 361/88 |
| 7,641,499 | B1 * | 1/2010 | George | B60L 3/0069 439/352 |
| 8,119,907 | B1 * | 2/2012 | McNutt | H01B 11/1008 174/36 |
| 8,154,831 | B2 * | 4/2012 | Wang | H01H 83/14 361/42 |
| 8,758,336 | B2 * | 6/2014 | Odell | A61B 18/1233 606/34 |
| 9,702,917 | B2 * | 7/2017 | Gale | G01R 31/52 |
| 9,928,939 | B1 * | 3/2018 | Volpone | H01R 9/031 |
| 9,956,027 | B2 * | 5/2018 | Newton | A61B 18/1233 |
| 10,204,062 | B2 * | 2/2019 | Lee | G06F 21/85 |
| 10,274,532 | B1 * | 4/2019 | Smith | B60R 16/03 |
| 10,367,294 | B1 * | 7/2019 | Smith | H01R 12/69 |
| 10,534,030 | B2 | 1/2020 | Burkman et al. | |
| 11,049,632 | B2 * | 6/2021 | Aromin | H01B 9/003 |
| 2001/0025846 | A1 * | 10/2001 | Kochman | H05B 3/34 219/545 |
| 2007/0159740 | A1 * | 7/2007 | Williams | H02H 3/33 361/42 |
| 2008/0007878 | A1 * | 1/2008 | Gandolfi | H02H 3/14 361/42 |
| 2008/0310848 | A1 * | 12/2008 | Yasuda | G02B 6/4416 398/115 |
| 2009/0189625 | A1 * | 7/2009 | Taunton | G01R 31/50 324/750.01 |
| 2010/0020452 | A1 * | 1/2010 | Gandolfi | H02H 3/16 361/42 |
| 2011/0037317 | A1 * | 2/2011 | Kuschnarew | B60L 3/0061 307/9.1 |
| 2015/0114711 | A1 * | 4/2015 | Dew | H01B 7/0045 174/72 A |
| 2015/0168480 | A1 * | 6/2015 | Robin | G01R 31/52 324/551 |
| 2015/0246647 | A1 * | 9/2015 | Sugino | B60R 16/0215 174/102 R |
| 2015/0316600 | A1 * | 11/2015 | Davis | G01R 31/54 324/543 |
| 2017/0194929 | A1 * | 7/2017 | Kochetov | B60L 1/00 |
| 2017/0222368 | A1 * | 8/2017 | Morello | H01R 24/40 |
| 2017/0288386 | A1 * | 10/2017 | Costa | H02H 7/228 |
| 2017/0292982 | A1 * | 10/2017 | Aceña | B60L 3/0069 |
| 2018/0356454 | A1 * | 12/2018 | Burkman | G01R 31/66 |
| 2019/0049508 | A1 * | 2/2019 | Davis | G01R 31/50 |
| 2020/0274375 | A1 * | 8/2020 | Griffiths | B60R 16/033 |
| 2022/0123542 | A1 * | 4/2022 | Ting | G01R 31/006 |

FOREIGN PATENT DOCUMENTS

| | | | | |
|---|---|---|---|---|
| CN | 103758822 | A * | 4/2014 | |
| CN | 105974236 | A * | 9/2016 | G01R 31/001 |
| CN | 107291000 | A * | 10/2017 | B60L 3/0069 |
| CN | 107310395 | A * | 11/2017 | |
| CN | 108896861 | A * | 11/2018 | G01R 31/006 |
| CN | 109155616 | A * | 1/2019 | B60R 16/02 |
| CN | 111231673 | A * | 6/2020 | |
| CN | 112462163 | A * | 3/2021 | |
| CN | 113219376 | A * | 8/2021 | |
| DE | 2537225 | A1 * | 8/1975 | |
| DE | 102014219645 | B4 * | 12/2020 | B60R 16/023 |
| DE | 112015002943 | B4 * | 12/2021 | B60R 16/0215 |
| DE | 102020209064 | A1 * | 1/2022 | |
| DE | 102020212917 | A1 * | 4/2022 | |
| EP | 0831334 | A2 * | 3/1998 | |
| EP | 2743712 | A1 * | 6/2014 | G01R 31/026 |
| EP | 2743712 | B1 * | 10/2018 | G01R 31/026 |
| EP | 3929020 | A1 * | 12/2021 | B60L 3/0046 |
| FR | 2538911 | A1 * | 12/1983 | |
| FR | 2564595 | A1 * | 5/1984 | |
| GB | 2277381 | A * | 10/1994 | G01R 31/02 |
| GB | 2459985 | A * | 11/2009 | G01R 31/3278 |
| IT | 1086752 | B * | 5/1985 | G01R 31/026 |
| JP | H04325340 | A * | 11/1982 | |
| JP | H10125141 | A * | 5/1995 | |
| JP | 2001268736 | A * | 9/2001 | |
| JP | 2002525635 | A * | 8/2002 | |
| JP | 2009095186 | A * | 4/2009 | B60R 16/0215 |
| KR | 20090109373 | A * | 10/2009 | |
| KR | 20210155398 | A * | 12/2021 | |
| WO | WO-8803653 | A1 * | 5/1988 | |
| WO | WO-9422383 | A1 * | 10/1994 | A61B 18/1233 |
| WO | WO-2007119874 | A1 * | 10/2007 | B60K 6/26 |
| WO | WO-2014070851 | A1 * | 5/2014 | B60R 16/0207 |
| WO | WO-2016088532 | A1 * | 6/2016 | B60R 16/0207 |
| WO | WO-2017221820 | A1 * | 12/2017 | H01R 13/688 |
| WO | WO-2019054128 | A1 * | 3/2019 | B60L 1/00 |
| WO | WO-2019224502 | A1 * | 11/2019 | H01R 4/183 |
| WO | WO-2020179403 | A1 * | 9/2020 | B60L 1/00 |
| WO | WO-2021053635 | A2 * | 3/2021 | G01R 31/1272 |
| WO | WO-2021149494 | A1 * | 7/2021 | |

OTHER PUBLICATIONS

Cooper, L., "High Current Connector Includes HVIL Safety Features", Electronic Specifier, Jan. 30, 2018, https://www.electronicspecifier.com/products/cables-and-connecting/high-current-connector-includes-hvil-safety-features, (1 page).

Tesla Motors, Inc., "Tech Note: HVIL Diagnostic Guide", TN-13-14-003, Jun. 26, 2013 (13 pp).

TE Connectivity, "TE Internal # 1-2103177-1", HVA 280, Housing for Female Terminals, Wire-to-Board / Wire-to-Device, 2 Position, 10.4mm [.409in] Centerline, Sealable, Orange, Signal, TE.com, Downloaded Oct. 20, 2020 (5 pp).

TE Connectivity, "TE Internal #: 4-2103015-5", HVA 280, Housing for Female Terminals, Wire-to-Device / Wire-to-Board, 2 Position, 10.4mm [.409in] Centerline, Sealable, Orange, Signal, TE.com, Downloaded Oct. 20, 2020 (6 pp).

(56) References Cited

OTHER PUBLICATIONS

TE Connectivity, "TE Internal #: 1-2103124-5", HVA 280, Automotive Headers, 4 Position 10.4mm [.409in] Centerline, Sealable, Vertical, 1/2 Row, Orange, Through Hole—Press-Fit, Silver (Ag), TE.com, Downloaded Oct. 20, 2020 (5 pp).

Philavanh, V., "High-Voltage Connector Design: Connector Types & Design Issues", https://www.arrow.com/en/research-and-events/articles/design-issues-in-high-voltage-connectors, Jul. 16, 2020 (7 pp).

* cited by examiner

ELECTRICAL CONNECTION MONITORING USING CABLE SHIELDING

TECHNICAL FIELD

This disclosure relates to electrical connection monitoring using cable shielding.

BACKGROUND

It is desirable to have a way to monitor the connection status of electrical cables in order to provide the correct action for different situations. It becomes extremely important to have this monitoring mechanism on a high voltage circuit loop in order to ensure the safety of the end user. Vehicle industries have been using the High Voltage Interlock Loop (HVIL) for many years. HVIL uses extra wires and connectors to form a connection loop that passes through a set of cable connections. When the connectivity of the HVIL loop is interrupted, the HVIL system indicates that at least one of the cable connectors in the loop has become disconnected from its mated connector. Typically, an HVIL system is not able to determine the location of a discontinuity within its loop and may need to shut down all modules connected on the loop.

SUMMARY

Disclosed herein are implementations of electrical connection monitoring using cable shielding.

In a first aspect, the subject matter described in this specification can be embodied in systems that include a high-voltage power supply; a first high-voltage cable including a first conductor connected to the high-voltage power supply and a first shielding that encircles the first conductor; a second high-voltage cable including a second conductor connected to the high-voltage power supply and a second shielding that encircles the second conductor; and a continuity detection circuit connected to the first shielding and to the second shielding, wherein the second shielding is connected to the first shielding to form a loop with the continuity detection circuit.

In a second aspect, the subject matter described in this specification can be embodied in systems that include a high-voltage power supply; a high-voltage cable including a conductor connected to the high-voltage power supply and a shielding that encircles the conductor; and a continuity detection circuit connected to the shielding, wherein the high-voltage power supply is part of a vehicle including a chassis that is coupled to a ground node of the continuity detection circuit and the continuity detection circuit is connected to the shielding at a first end of the high-voltage cable and the shielding is coupled to the chassis at a second end of the high-voltage cable, and wherein the continuity detection circuit is configured to drive current through the shielding that returns via the chassis.

In a third aspect, the subject matter described in this specification can be embodied in methods that include applying a voltage to a shielding of a cable; and monitoring connectivity of the cable by sensing changes in current flow through the shielding of the cable.

In a fourth aspect, the subject matter described in this specification can be embodied in systems that include a high-voltage power supply; a high-voltage cable including a conductor connected to the high-voltage power supply and a shielding that encircles the conductor; and a continuity detection circuit connected to the shielding.

In a fifth aspect, the subject matter described in this specification can be embodied in systems that include a cable including a conductor and a shielding that encircles the conductor; and a continuity detection circuit connected to the shielding.

BRIEF DESCRIPTION OF THE DRAWINGS

Described herein are systems and methods for electrical connection monitoring using cable shielding.

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Described herein are systems and methods for electrical connection monitoring using cable shielding. Implementing cable connectivity monitoring using cable shielding may enable individual monitoring of the connection status of individual modules without adding costs, effort, and weight associated with low voltage wire harnesses of conventional HIVL systems. Some implementations, may provide the benefits of simplifying harness connections and enabling the system to distinguish between different types of disruptions of continuity (e.g., short circuit conditions vs. open circuit conditions) which may be correlated with different events such as cable connector disconnects, wire damage, or vehicle crash events.

For example, the techniques using shielding to monitor cable connectivity may be used in a variety of systems using different types of shielded cables. For example, the techniques may be applied in high-voltage power distribution systems. In the high-voltage cable context, there is often a cable shielding for the purpose electromagnetic interference (EMI) protection. Cable shielding is typically connected to a ground node as a drain without any real signal functionality. Utilizing this shielding for circuits monitoring connectivity of the cables may enable removal the extra wires and connectors from the system and provide the real-time high-voltage circuits monitoring with individual module control. For example, these techniques and architectures may be used in vehicles (e.g., a car or a truck). These strategies may also be implemented in other types of systems that use cables which have shielding, like shielded alternating current (AC), Ethernet, or coaxial cable (e.g., for cable modems). In the past, integrated connectivity monitoring architectures have typically been used in high-voltage systems for safety reasons that justified the use of resources, so it is called HVIL. However, the techniques and architecture described herein may also be used to monitor low-voltage circuits. For example, three-phase cable for motors, 48-Volt systems, and robust autonomous systems, among others.

Some implementations of the systems and methods describe herein may provide advantages, such as, cuts to a cable or other cable damage may be detected as fault conditions using a continuity detection circuit connected to shielding of the cable. For example, the use of additional wiring to high-voltage connectors that attach the high-voltage cables that is typical of traditional HVIL systems may be avoided. For example, individual monitoring of load modules may be enabled. Some implementations may distinguish between open circuit and short circuit conditions, which may enable different handling of different types of disruptions of an electrical connection through a cable by selecting different actions in response.

Figure 1A:
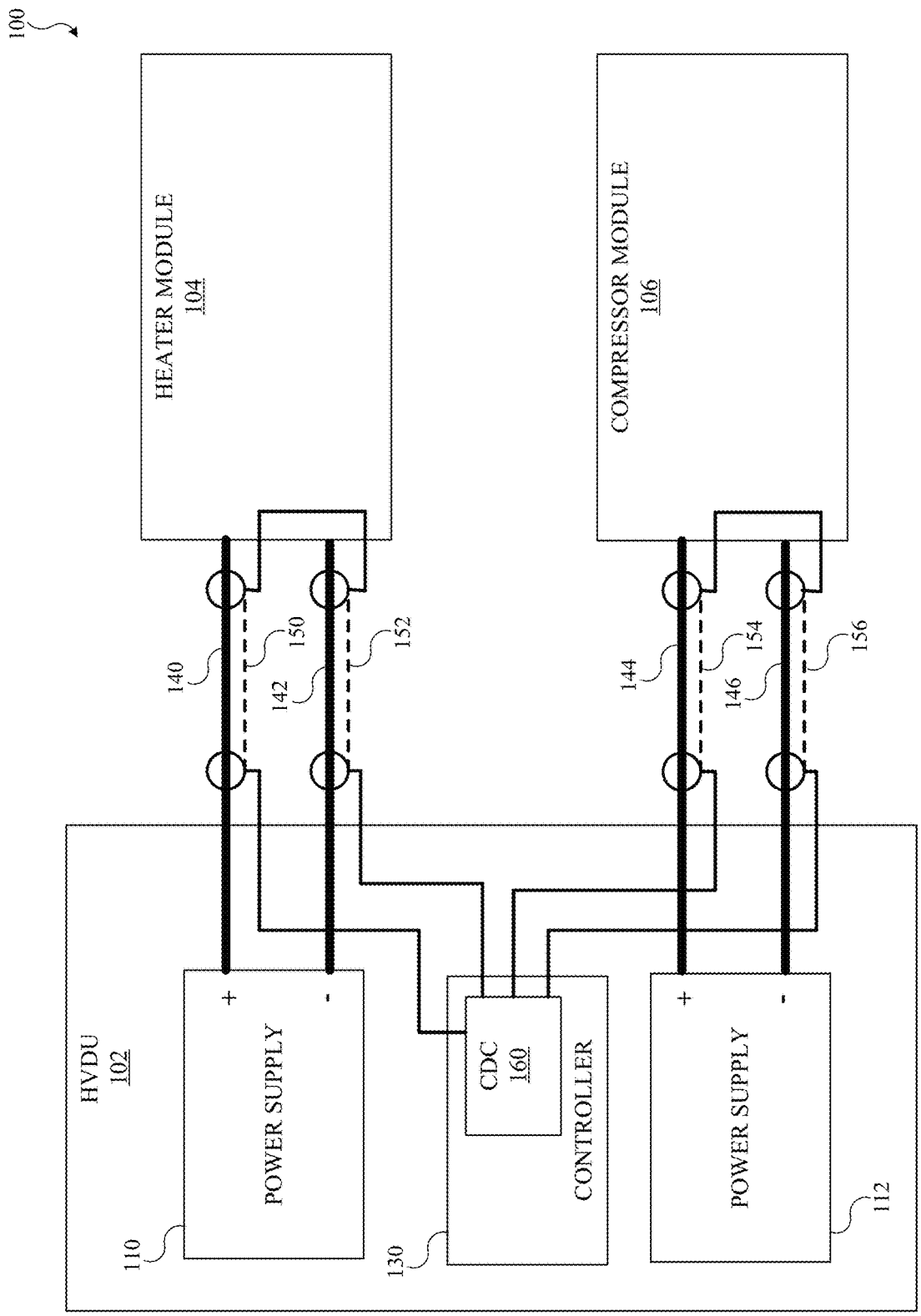
FIG. 1A is a circuit diagram of an example of a system for electrical connection monitoring using cable shielding.

FIG. 1A is a circuit diagram of an example of a system 100 for electrical connection monitoring using cable shielding. The system 100 includes a high-voltage distribution unit (HVDU) 102 (e.g., a battery pack) that is connected to two peripheral or load modules—a heater module 104 and a compressor module 106—via high-voltage cables. The high-voltage distribution unit 102 includes a first high-voltage power supply 110 and a second high-voltage power supply 112. The high-voltage distribution unit 102 includes a controller 130 of the high-voltage distribution unit 102. The system 100 includes a first high-voltage cable including a first conductor 140 connected to the first high-voltage power supply 110 and a first shielding 150 that encircles the first conductor 140. The system 100 includes a second high-voltage cable including a second conductor 142 connected to the first high-voltage power supply 110 and a second shielding 152 that encircles the second conductor 142. The system 100 includes a third high-voltage cable including a third conductor 144 connected to the second high-voltage power supply 112 and a third shielding 154 that encircles the third conductor 144. The system 100 includes a fourth high-voltage cable including a fourth conductor 146 connected to the second high-voltage power supply 112 and a fourth shielding 156 that encircles the fourth conductor 146. The system 100 includes a continuity detection circuit 160 connected to the first shielding 150 and to the second shielding 152. The second shielding 152 is connected to the first shielding 150 to form a loop with the continuity detection circuit 160. The continuity detection circuit 160 is connected to the third shielding 154 and to the fourth shielding 156. The fourth shielding 156 is connected to the third shielding 154 to form a loop with the continuity detection circuit 160. The system 100 may be configured to monitor connection status for the cables of a loop, including interruptions caused by cuts or other damage to the cables themselves and their connections to the high-voltage distribution unit 102 and their respective peripheral module. In some implementations, the system 100 is part a vehicle. For example, the system 100 may be used to implement the process 700 of FIG. 7.

The system 100 includes a first high-voltage power supply 110. The first high-voltage power supply 110 includes a positive terminal and a negative terminal. For example, the first high-voltage power supply 110 may be configured as a voltage source providing a direct current voltage greater than 60 Volts. In some implementations, the first high-voltage power supply 110 provides power at a direct current voltage greater than 1500 Volts. For example, the first high-voltage power supply 110 may be configured as a voltage source providing an alternating current voltage greater than 30 Volts. In some implementations, the first high-voltage power supply 110 provides power at an alternating current root mean square voltage greater than 1000 Volts. For example, the first high-voltage power supply 110 may be configured as a current source. For example, the first high-voltage power supply 110 may include a high-voltage battery. The first high-voltage power supply 110 is part of a high-voltage distribution unit 102 that is configured to provide power at high voltages to peripheral modules (e.g., peripheral modules in a vehicle). The first high-voltage power supply 110 is configured to provide power to the heater module 104. In this example, the high-voltage distribution unit 102 also includes a second high-voltage power supply 112. The second high-voltage power supply 112 is configured to provide power to the compressor module 106.

For example, the high-voltage distribution unit 102 may house the first high-voltage power supply 110, the second high-voltage power supply 112, and the continuity detection circuit 160.

The system 100 includes a first high-voltage cable including a first conductor 140 connected to the first high-voltage power supply 110 and a first shielding 150 that encircles the first conductor 140. For example, the first high-voltage cable may be a coaxial cable with the first conductor 140 as an inner, central conductor and the first shielding 150 as a concentric conducting shield that is separated from the first conductor 140 by a concentric dielectric insulator. The first high-voltage cable may also include a protective outer sheath (e.g., a plastic jacket) that encircles the first shielding 150. For example, the first shielding 150 may be made of copper or aluminum tape or conducting polymer. The first shielding 150 may act as a Faraday cage to reduce electromagnetic radiation. In this example, the first conductor 140 is connected to a positive terminal of the first high-voltage power supply 110 in the high-voltage distribution unit 102.

The system 100 includes a second high-voltage cable including a second conductor 142 connected to the first high-voltage power supply 110 and a second shielding 152 that encircles the second conductor 142. For example, the second high-voltage cable may be a coaxial cable with the second conductor 142 as an inner, central conductor and the second shielding 152 as a concentric conducting shield that is separated from the second conductor 142 by a concentric dielectric insulator. The second high-voltage cable may also include a protective outer sheath (e.g., a plastic jacket) that encircles the second shielding 152. For example, the second shielding 152 may be made of copper or aluminum tape or conducting polymer. The second shielding 152 may act as a Faraday cage to reduce electromagnetic radiation. In this example, the second conductor 142 is connected to a negative terminal of the first high-voltage power supply 110 in the high-voltage distribution unit 102.

The first high-voltage cable and the second high-voltage cable may be used to connect the high-voltage distribution unit 102 to the heater module 104. When these cables are properly connected, the first conductor 140 and the second conductor 142 may bear current to and from the heater module 104 to supply electrical power to the heater module 104.

Similarly, the system 100 includes a third high-voltage cable including a third conductor 144 connected to the second high-voltage power supply 112 and a third shielding 154 that encircles the third conductor 144. The system 100 includes a fourth high-voltage cable including a fourth conductor 146 connected to the second high-voltage power supply 112 and a fourth shielding 156 that encircles the fourth conductor 146. In this example, the third conductor 144 is connected to a positive terminal and the fourth conductor 146 is connected to a negative terminal of the second high-voltage power supply 112 in the high-voltage distribution unit 102. The third high-voltage cable and the fourth high-voltage cable may be used to connect the high-voltage distribution unit 102 to the compressor module 106. When these cables are properly connected, the third conductor 144 and the fourth conductor 146 may bear current to and from the compressor module 106 to supply electrical power to the compressor module 106.

The system 100 includes a continuity detection circuit 160 connected to the first shielding 150 and to the second shielding 152. The second shielding 152 is connected to the first shielding 150 to form a loop with the continuity detection circuit 160. For example, the second shielding 152 may be connected to the first shielding 150 via a jumper in a connector that attaches the first high-voltage cable and the second high-voltage cable to the heater module 104. In some implementations, the second shielding 152 may be connected to the first shielding 150 via a wire inside the heater module 104. For example, the second shielding 152 may be connected to the first shielding 150 in the loop with the continuity detection circuit 160 as described in FIG. 2. The continuity detection circuit 160 may have any of a variety of topologies for continuity detection. For example, the continuity detection circuit 160 may include a low-voltage current source that drives current through the loop that includes the first shielding 150 and the second shielding 152 and a high-impedance voltmeter configured to measure the current flowing through this loop. In some implementations, a general-purpose input/output (GPIO) pin of an integrated circuit is configured as part of the continuity detection circuit 160 to supply current or voltage that are applied to the loop including the first shielding 150 and the second shielding 152 and/or a GPIO pin is configured as part of the continuity detection circuit 160 to measure voltage or current that flows through this loop. When the expected current is found to flow through the loop including the first shielding 150 and the second shielding 152 and the continuity detection circuit 160, the continuity detection circuit 160 determines that the first high-voltage cable and second high-voltage cable are properly attached between the high-voltage distribution unit 102 and the heater module 104. When an interruption in this expected current flow through this loop is detected by the continuity detection circuit 160, then the continuity detection circuit 160 determines that an error condition has manifested on the first shielding 150 and/or the second shielding 152. For example, a high-voltage connector that attaches the first shielding 150 and/or the second shielding 152 to the high-voltage distribution unit 102 or to the heater module 104 may become disconnected from a mated connecter, which may be detected as an error or interruption condition by the continuity detection circuit 160. For example, the first shielding 150 or the second shielding 152 may become cut or severed somewhere along their length, which may be detected as an error or interruption condition by the continuity detection circuit 160.

In either of these two fault scenarios (i.e., a cable is cut or a cable becomes disconnected), the controller 130 of the high-voltage distribution unit 102 may be configured to take a corrective action responsive to the continuity detection circuit 160 detecting that a fault condition has occurred. In some implementations, the controller 130 may be configured to stop the flow of high-voltage current from the first high-voltage power supply 110 through the first conductor 140 and the second conductor 142 responsive to detection of a disruption of continuity by the continuity detection circuit 160. For example, the controller 130 may include a safety circuit configured to, responsive to detection of a disruption of continuity by the continuity detection circuit 160, stop current flow from the high-voltage power supply 110 through the first conductor 140.

For example, the high-voltage power supply 110 may be part of a vehicle (e.g., a car or a truck) including a chassis that is coupled to a ground node of the continuity detection circuit 160. In some implementations, the system 100 includes a high-voltage module connector that attaches the first high-voltage cable and the second high-voltage cable to a load module (e.g., the heater module 104), and a jumper in the high-voltage module connector that connects the first shielding 150 and the second shielding 152.

In some implementations, the continuity detection circuit 160 has direct current isolation from a ground node of the high-voltage power supply 110. For example, the continuity detection circuit 160 and the first shielding 150 and the second shielding 152 may be connected as shown in the example system 200 of FIG. 2.

Similarly, the continuity detection circuit 160 may be connected to the third high-voltage cable and the fourth high-voltage cable to form a second loop for monitoring electrical connection status between the high-voltage distribution unit 102 and the compressor module 106. The continuity detection circuit 160 may be configured to detect either of the two fault scenarios (i.e., a cable is cut or a cable becomes disconnected) and the controller 130 of the high-voltage distribution unit 102 may be configured to take a corrective action responsive to the continuity detection circuit 160 detecting that a fault condition has occurred on the second loop. In some implementations, the controller 130 may be configured to stop the flow of high-voltage current from the second high-voltage power supply 112 through the third conductor 144 and the fourth conductor 146 responsive to detection of a disruption of continuity by the continuity detection circuit 160. For example, the controller 130 may include a safety circuit configured to, responsive to detection of a disruption of continuity by the continuity detection circuit 160, stop current flow from the high-voltage power supply 112 through the third conductor 144.

In some implementations (not shown in FIG. 1A), the continuity detection circuit 160 may be housed in a load module (e.g., the heater module 104 or the compressor module 106) rather than in the high-voltage distribution unit 102. For example, a system may include a high-voltage distribution unit that houses the high-voltage power supply (e.g., the high-voltage power supply 110), where the high-voltage distribution unit is attached to a first end of the first high-voltage cable; and a load module that houses a continuity detection circuit (e.g., the continuity detection circuit 160), where the load module is attached to a second end of the first high-voltage cable.

The system 100 may provide advantages over conventional High Voltage Interlock Loop (HVIL) systems. For example, cuts to a cable or other cable damage may be detected as fault conditions using the continuity detection circuit 160 in the loop with the first shielding 150 and the second shielding 152. For example, the use of additional wiring to high-voltage connectors that attach the high-voltage cables that is typical of traditional HVIL systems may be avoided. For example, the system 100 may enable individual monitoring of load modules, such as the heater module 104 or the compressor module 106.

Figure 1B:
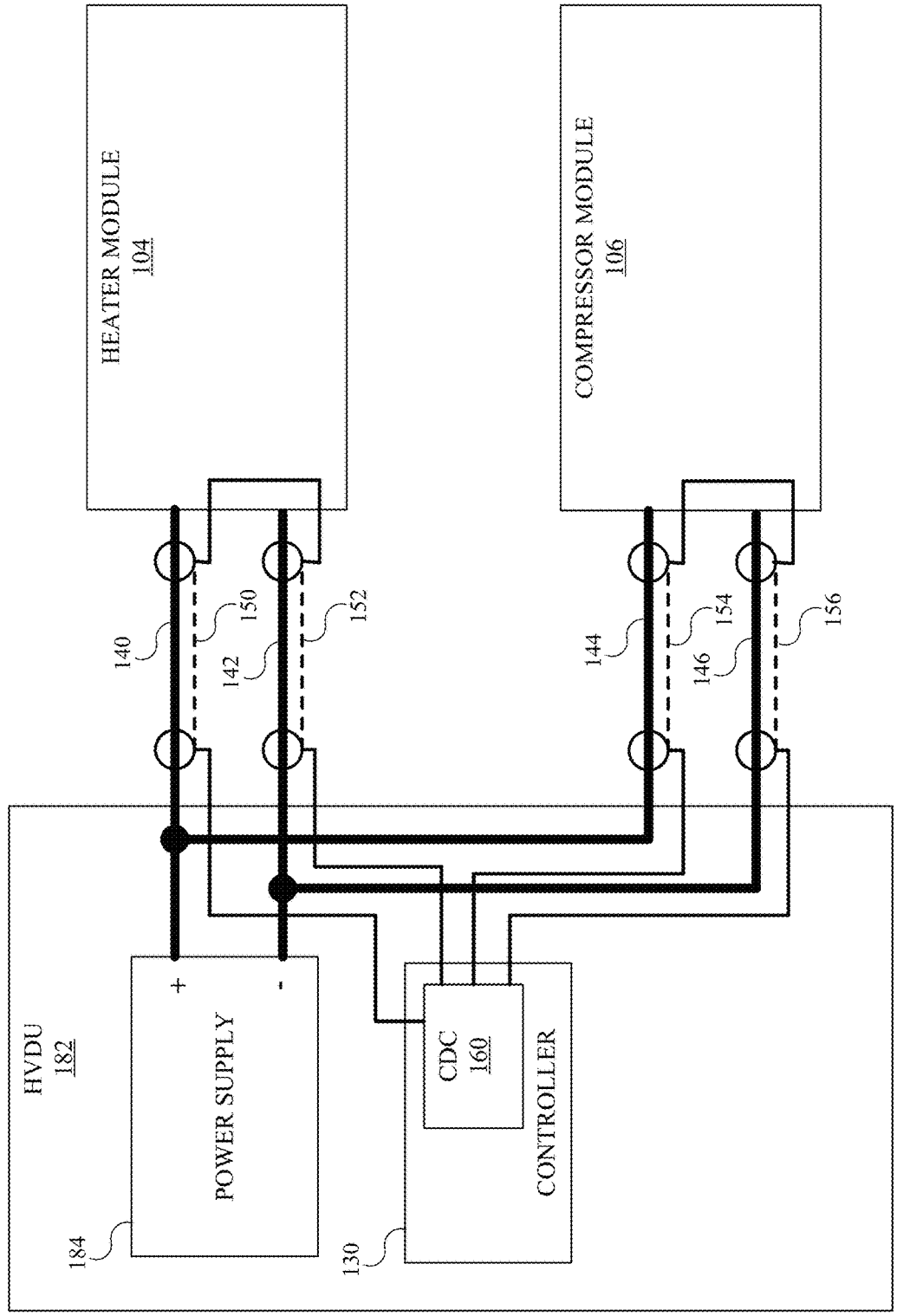
FIG. 1B is a circuit diagram of an example of a system for electrical connection monitoring using cable shielding with a power supply that is shared by multiple load modules.

FIG. 1B is a circuit diagram of an example of a system 180 for electrical connection monitoring using cable shielding with a power supply that is shared by multiple load modules. The system includes a high-voltage distribution unit (HVDU) 182 that includes a high-voltage power supply 184 that is supplies power to multiple load modules (i.e., the heater module 104 and the compressor module 106). For example, the high-voltage power supply 184 may include a direct current (DC) voltage source that supplies current to its load modules in parallel. In some implementations, the first conductor 140 and the third conductor 144 may be connected to the positive terminal of the high-voltage power supply 184 by respective switches (not explicitly shown in FIG. 1B) that can be opened to individually disconnect the first conductor 140 or the third conductor 144 from the high-voltage power supply 184 and stop the flow of current from the high-voltage power supply 184 through the first conductor 140 or the third conductor 144 to its respective load module. Similarly, the second conductor 142 and the fourth conductor 146 may be connected to the negative terminal of the high-voltage power supply 184 by respective switches (not explicitly shown in FIG. 1B) that can be opened to individually disconnect the second conductor 142 or the fourth conductor 146 from the high-voltage power supply 184.

Figure 2:
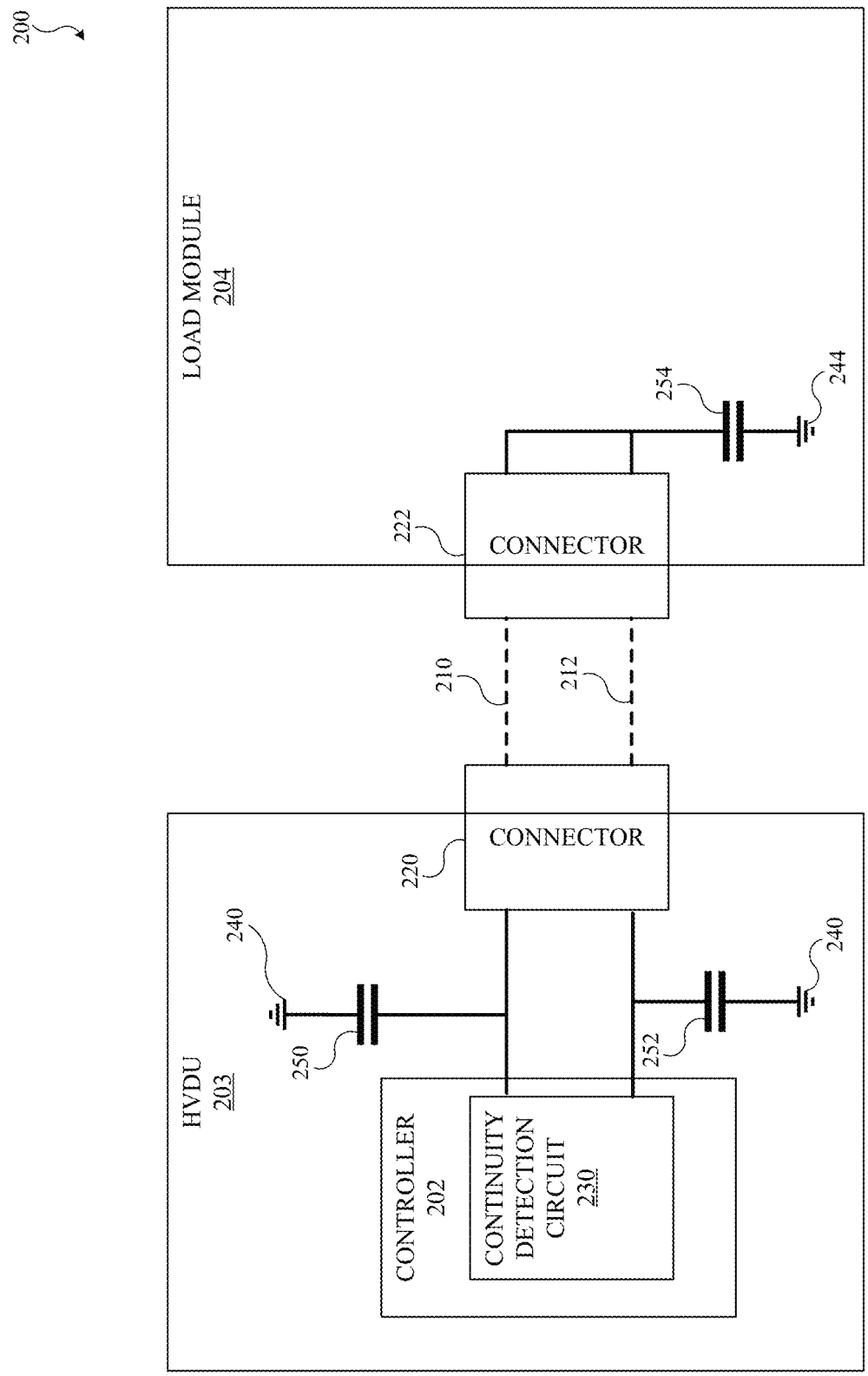
FIG. 2 is a circuit diagram of an example of a system for electrical connection monitoring using shielding of two cables to form a loop.

FIG. 2 is a circuit diagram of an example of a system 200 for electrical connection monitoring using shielding of two cables to form a loop. The system 200 includes a controller 202 in a high-voltage distribution unit 203 (e.g., a high-voltage distribution unit in a vehicle) and a load module 204 that receives electrical power from the high-voltage distribution unit 203. The high-voltage distribution unit 203 and the load module 204 are connected via high-voltages cables that include a first shielding 210 and a second shielding 212. At the high-voltage distribution unit 203, a first connector 220 attaches a first end of high-voltage cables to the high-voltage distribution unit 203. At the load module 204, a second connector 222 attaches a second end of high-voltage cables to the load module 204. The controller 202 includes a continuity detection circuit 230 (e.g., the continuity detection circuit 160) that is connected, via the first connector 220, to the first shielding 210 and the second shielding 212 to form a loop for monitoring the electrical connection status for the load module 204. The first shielding 210 is coupled via the first connector 220 and an alternating current coupling capacitor 250 to a ground node 240 in the high-voltage distribution unit 203. The second shielding 212 is coupled via the first connector 220 and an alternating current coupling capacitor 252 to the ground node 240 in the high-voltage distribution unit 203. In the load module 204, the first shielding 210 and the second shielding 212 are connected to each other via the second connector 222 to form the loop for monitoring the electrical connection status. The first shielding 210 and the second shielding 212 are coupled via the second connector 222 and an alternating current coupling capacitor 254 to a ground node 240 in the load module 204. For example, the alternating current coupling capacitors 250, 252, and 254 may serve to reduce radiation from the first shielding 210 and the second shielding 212 and prevent or mitigate electromagnetic interference. For example, the system 200 may be used to implement the process 700 of FIG. 7.

For example, the first connector 220 may include a high-voltage harness connector mated with a high-voltage header connector. The first connector 220 may be configured to internally keep the first shielding 210 isolated from the second shielding 212. For example, the first connector 220 may include the high-voltage harness connector 860 of FIG. 8. For example, the second connector 222 may include a high-voltage harness connector mated with a high-voltage header connector. The second connector 222 may be configured to internally connect the first shielding 210 to the second shielding 212 (e.g., using a jumper or an internal metal plate that connects to both shieldings 210 and 212). For example, the second connector 222 may include the high-voltage harness connector 830 of FIG. 8.

For example, the ground node 240 of the high-voltage distribution unit 203 may be a ground node of a power supply of the high-voltage distribution unit 203. In some implementations, the continuity detection circuit 230 may have direct current isolation from a ground node of the high-voltage power supply (e.g., the high-voltage power supply 110). For example, the alternating current coupling capacitor 250 may couple the first shielding 210 to a ground node 240 (e.g., a ground node of the high-voltage power supply). For example, the alternating current coupling capacitor 252 may couple the second shielding 212 to a ground node 240 (e.g., a ground node of the high-voltage power supply). In some implementations, the system 200 is part a vehicle and the ground node 244 of the load module 204 is connected to the ground node 240 of the high-voltage distribution unit 203 via a chassis of the vehicle.

Conductors in the high-voltage distribution unit 203 that connect, via the first connector 220, the first shielding 210 and the second shielding 212 to the continuity detection circuit 230 and their respective alternating current coupling capacitors (250 and 252) may be, for example, wires or traces on a printed circuit board (PCB). As described in relation to the continuity detection circuit 160 above, the continuity detection circuit 230 may have a variety of topologies. For example, the continuity detection circuit 230 may include a current sensor or voltage sensor for monitoring the circuit continuity around the loop that includes the continuity detection circuit 230 and the first shielding 210 and the second shielding 212.

Figure 3:
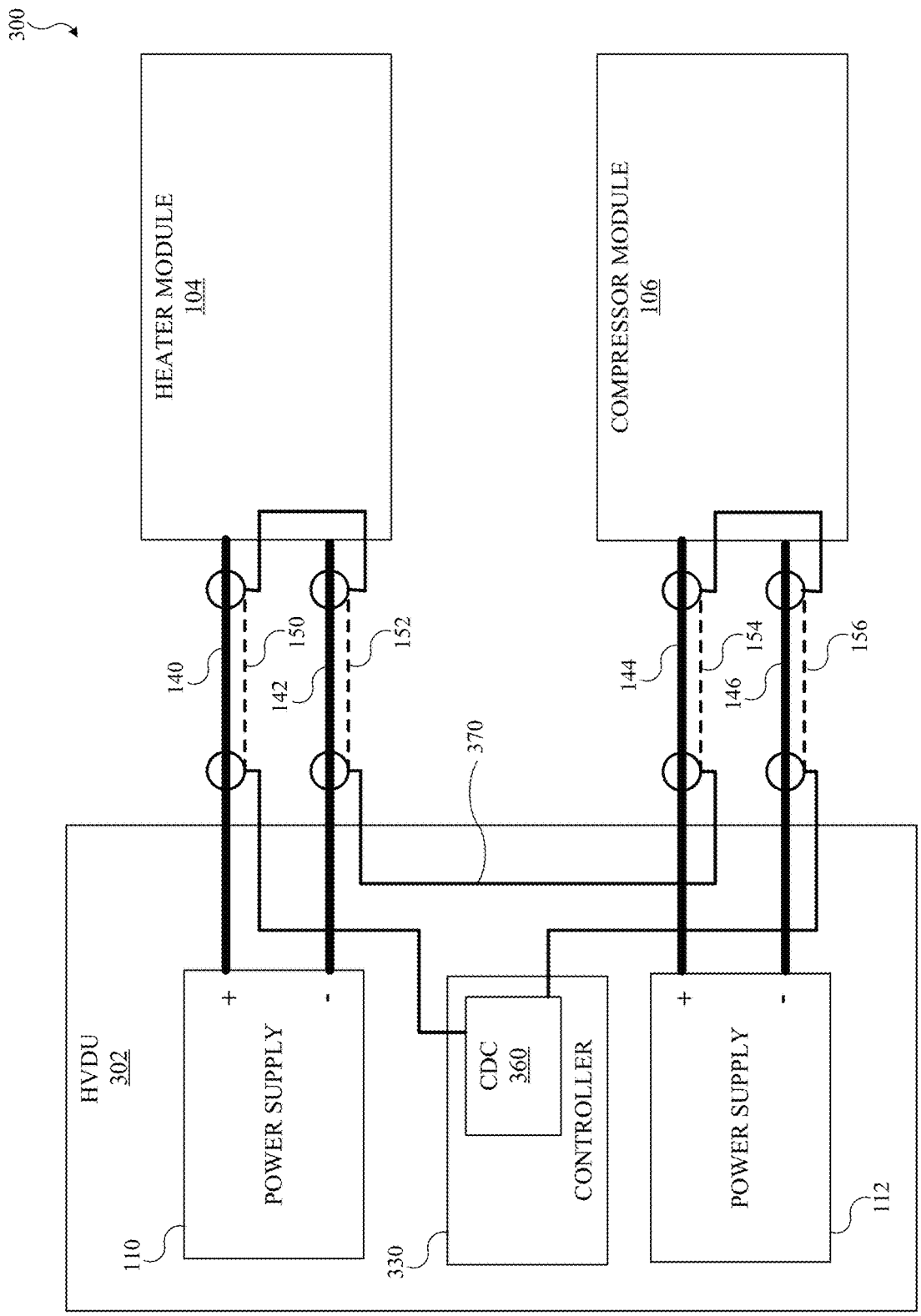
FIG. 3 is a circuit diagram of an example of a system for electrical connection monitoring using shielding of cables in series to form a loop through multiple peripheral modules.

FIG. 3 is a circuit diagram of an example of a system 300 for electrical connection monitoring using shielding of cables in series to form a loop through multiple peripheral modules. The system 300 includes a high-voltage distribution unit (HVDU) 302 that is connected to two peripheral or load modules—the heater module 104 and the compressor module 106—via high-voltage cables. The high-voltage distribution unit 302 includes the first high-voltage power supply 110 and the second high-voltage power supply 112. The high-voltage distribution unit 302 includes a controller 130 of the high-voltage distribution unit 302. The system 300 includes the first high-voltage cable including the first conductor 140 connected to the first high-voltage power supply 110 and the first shielding 150 that encircles the first conductor 140. The system 100 includes the second high-voltage cable including the second conductor 142 connected to the first high-voltage power supply 110 and the second shielding 152 that encircles the second conductor 142. The system 300 includes the third high-voltage cable including the third conductor 144 connected to the second high-voltage power supply 112 and the third shielding 154 that encircles the third conductor 144. The system 300 includes the fourth high-voltage cable including the fourth conductor 146 connected to the second high-voltage power supply 112 and the fourth shielding 156 that encircles the fourth conductor 146. The system 300 includes a continuity detection circuit 360 connected to the first shielding 150 and to the fourth shielding 156. The second shielding 152 is connected to the first shielding 150 at the heater module 104, the second shielding 152 is connected to the third shielding 154 via the conductor 370 in the high-voltage distribution unit 302, and the third shielding 154 is connected to the fourth shielding 156 at the compressor module 106 to form a loop with the continuity detection circuit 360. This loop includes shielding for connections to multiple load modules arranged in series. The system 300 may be configured to monitor connection status for the cables of this loop, including interruptions caused by cuts or other damage to the cables themselves and their connections to the high-voltage distribution unit 302 and their respective peripheral module. In some implementations, the system 300 is part a vehicle. For example, the system 300 may be used to implement the process 700 of FIG. 7.

Comparing the system 300 to the system 100 of FIG. 1A, the loop being monitored for continuity is expanded to include one or more additional shieldings (e.g., the third shielding 154 and the fourth shielding 156), of additional high-voltage cables, that are connected in series to form the loop with the continuity detection circuit. These additional shieldings may be associated with connections to additional load modules (e.g., the compressor module 106).

For example, the high-voltage distribution unit 302 may house the first high-voltage power supply 110, the second high-voltage power supply 112, and the continuity detection circuit 360.

The system 300 includes a continuity detection circuit 360 connected to the first shielding 150 and to the fourth shielding 156. The second shielding 152 is connected to the first shielding 150 at the heater module 104, the second shielding 152 is connected to the third shielding 154 via the conductor 370 in the high-voltage distribution unit 302, and the third shielding 154 is connected to the fourth shielding 156 at the compressor module 106 to form a loop with the continuity detection circuit 360. For example, the second shielding 152 may be connected to the first shielding 150 via a jumper in a connector that attaches the first high-voltage cable and the second high-voltage cable to the heater module 104. In some implementations, the second shielding 152 may be connected to the first shielding 150 via a wire inside the heater module 104. For example, the second shielding 152 may be connected to the first shielding 150 as described in FIG. 2. The third shielding 154 may be connected to the fourth shielding 156 in at the compressor module 106 in a similar manner. For example, the conductor 370 may include a trace on printed circuit board and/or a wire in the high-voltage distribution unit 302. The conductor 370 may connect to the second shielding 152 and the third shielding 154 through respective connectors at the high-voltage distribution unit 302 (e.g., as described in relation the first connector 220 of FIG. 2). The continuity detection circuit 360 may have any of a variety of topologies for continuity detection. For example, the continuity detection circuit 360 may include a low-voltage current source that drives current through the loop that includes the first shielding 150, the second shielding 152, the third shielding 154, and the fourth shielding 156. For example, the continuity detection circuit 360 may also include a high-impedance voltmeter configured to measure the current flowing through this loop. In some implementations, a general-purpose input/output (GPIO) pin of an integrated circuit is configured as part of the continuity detection circuit 360 to supply current or voltage that are applied to the loop and/or a GPIO pin is configured as part of the continuity detection circuit 360 to measure current or voltage that flow through this loop. When the expected current is found to flow through the loop including the shielding for cables attached to multiple load modules, the continuity detection circuit 360 determines that the first high-voltage cable, the second high-voltage cable, the third high-voltage cable, and the fourth high-voltage cable are properly attached between the high-voltage distribution unit 302 and their respective load modules (e.g., the heater module 104 and the compressor module 106). When an interruption in this expected current flow through this loop is detected by the continuity detection circuit 360, then the continuity detection circuit 360 determines that an error condition has manifested on the first shielding 150, the second shielding 152, the third shielding 154, and/or the fourth shielding 156. For example, a high-voltage connector that attaches the first shielding 150 and/or the second shielding 152 to the high-voltage distribution unit 302 or to the heater module 104 may become disconnected from a mated connecter, which may be detected as an error or interruption condition by the continuity detection circuit 160. For example, a high-voltage connector that attaches the third shielding 154 and/or the fourth shielding 156 to the high-voltage distribution unit 302 or to the compressor module 106 may become disconnected from a mated connecter, which may be detected as an error or interruption condition by the continuity detection circuit 360. For example, the first shielding 150, the second shielding 152, the third shielding 154, or the fourth shielding 156 may become cut or severed somewhere along their length, which may be detected as an error or interruption condition by the continuity detection circuit 360.

In either of these two fault scenarios (i.e., a cable is cut or a cable becomes disconnected), the controller 330 of the high-voltage distribution unit 302 may be configured to take a corrective action responsive to the continuity detection circuit 360 detecting that a fault condition has occurred. In some implementations, the controller 330 may be configured to stop the flow of high-voltage current from the first high-voltage power supply 110 through the first conductor 140 and the second conductor 142 and stop the flow of high-voltage current from the second high-voltage power supply 112 through the third conductor 144 and the fourth conductor 146 responsive to detection of a disruption of continuity by the continuity detection circuit 360. For example, the controller 330 may include a safety circuit configured to, responsive to detection of a disruption of continuity by the continuity detection circuit 360, stop current flow from the high-voltage power supply 110 through the first conductor 140.

For example, the high-voltage power supply 110 may be part of a vehicle (e.g., a car or a truck) including a chassis that is coupled to a ground node of the continuity detection circuit 360. In some implementations, the system 300 includes a high-voltage module connector that attaches the first high-voltage cable and the second high-voltage cable to a load module (e.g., the heater module 104), and a jumper in the high-voltage module connector that connects the first shielding 150 and the second shielding 152.

In some implementations, the continuity detection circuit 360 has direct current isolation from a ground node of the high-voltage power supply 110. For example, the continuity detection circuit 360 and the first shielding 150, the second shielding 152, the third shielding 154, and the fourth shielding 156 may be coupled to one or more ground nodes via capacitors as shown in the example system 200 of FIG. 2.

Figure 4:
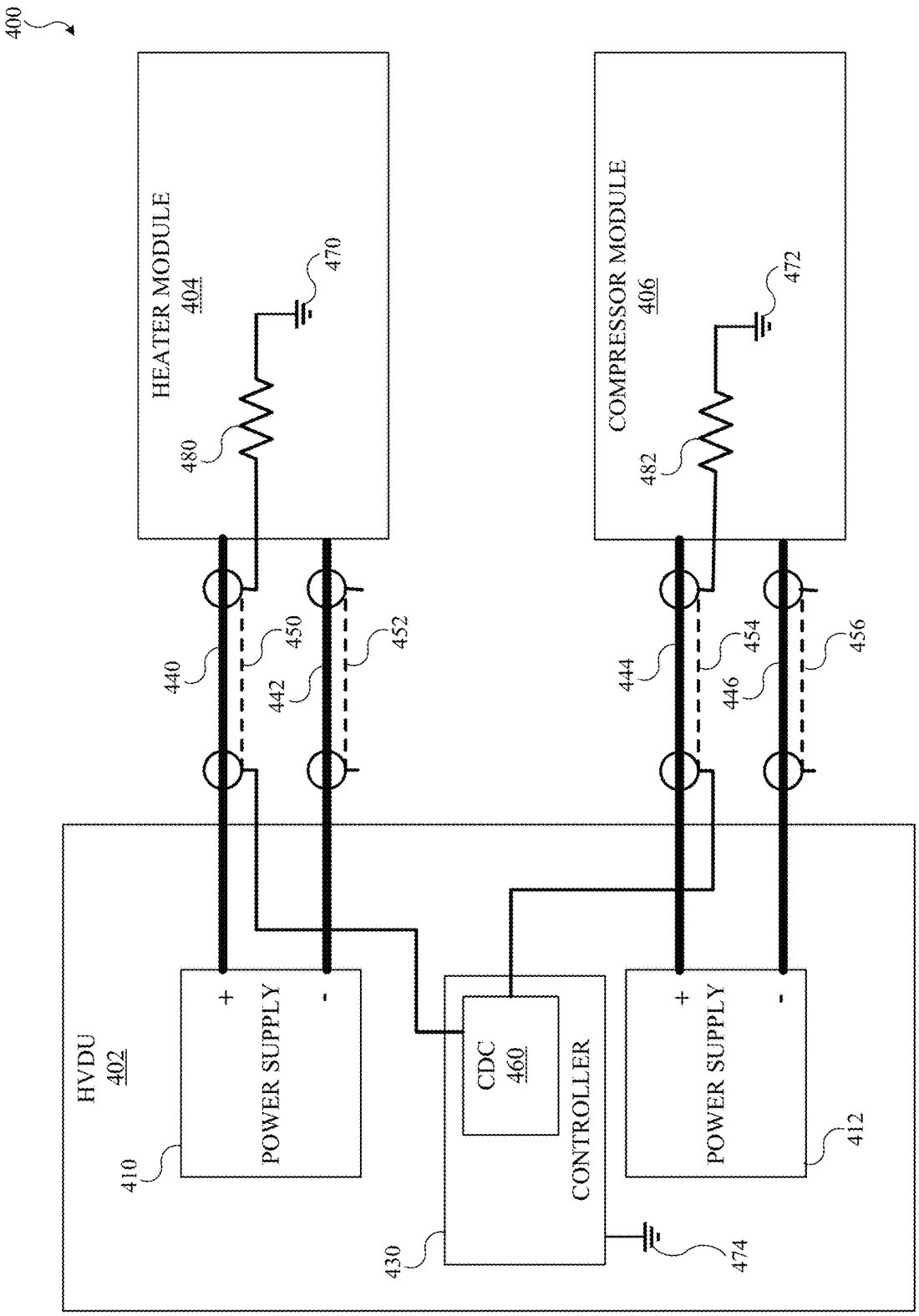
FIG. 4 is a circuit diagram of an example of a system for electrical connection monitoring using shielding of individual cables.

FIG. 4 is a circuit diagram of an example of a system 400 for electrical connection monitoring using shielding of individual cables. The system 400 includes a high-voltage distribution unit (HVDU) 402 (e.g., a battery pack) that is connected to two peripheral or load modules—a heater module 404 and a compressor module 406—via high-voltage cables. The high-voltage distribution unit 402 includes a first high-voltage power supply 410 and a second high-voltage power supply 412. The high-voltage distribution unit 402 includes a controller 430 of the high-voltage distribution unit 402. The system 400 includes a first high-voltage cable including a first conductor 440 connected to the first high-voltage power supply 410 and a first shielding 450 that encircles the first conductor 440. The system 400 includes a second high-voltage cable including a second conductor 442 connected to the first high-voltage power supply 410 and a second shielding 452 that encircles the second conductor 442. The system 400 includes a third high-voltage cable including a third conductor 444 connected to the second high-voltage power supply 412 and a third shielding 454 that encircles the third conductor 444. The system 400 includes a fourth high-voltage cable including a fourth conductor 446 connected to the second high-voltage power supply 412 and a fourth shielding 456 that encircles the fourth conductor 446. The system 400 includes a continuity detection circuit 460 connected to the first shielding 450. The first high-voltage power supply 410 may be part of a vehicle including a chassis that is coupled to a ground node 474 of the continuity detection circuit 460 and the continuity detection circuit 460 is connected to the first shielding 450 at a first end of the high-voltage cable and the first shielding 450 is coupled to the chassis at a second end of the high-voltage cable. The continuity detection circuit 460 may be configured to drive current through the first shielding 450 that returns via the chassis. For example, the chassis may be connected to a ground node 470 of the heater module 404 and the first shielding 450 may be coupled to the chassis at the ground node 470 via a first resistor 480. The continuity detection circuit 460 is connected to the third shielding 454. The second high-voltage power supply 412 may be part of the vehicle including the chassis that is coupled to the ground node 474 of the continuity detection circuit 460 and the continuity detection circuit 460 is connected to the third shielding 454 at a first end of the high-voltage cable and the third shielding 454 is coupled to the chassis at a second end of the high-voltage cable. The continuity detection circuit 460 may be configured to drive current through the first shielding 450 that returns via the chassis. For example, the chassis may be connected to a ground node 472 of the compressor module 406 and the third shielding 454 may be coupled to the chassis at the ground node 472 via a second resistor 482. The system 400 may be configured to monitor connection status for the cables that are individually connected to the continuity detection circuit 460, including interruptions caused by cuts or other damage to the cables themselves and their connections to the high-voltage distribution unit 402 and their respective peripheral module. In some implementations, the system 400 is part a vehicle. For example, the system 400 may be used to implement the process 700 of FIG. 7.

The system 400 includes a first high-voltage power supply 410. The first high-voltage power supply 410 includes a positive terminal and a negative terminal. For example, the first high-voltage power supply 410 may be configured as a voltage source providing a direct current voltage greater than 60 Volts. In some implementations, the first high-voltage power supply 410 provides power at a direct current voltage greater than 1500 Volts. For example, the first high-voltage power supply 410 may be configured as a voltage source providing an alternating current voltage greater than 30 Volts. In some implementations, the first high-voltage power supply 410 provides power at an alternating current root mean square voltage greater than 1000 Volts. For example, the first high-voltage power supply 410 may be configured as a current source. For example, the first high-voltage power supply 410 may include a high-voltage battery. The first high-voltage power supply 410 is part of a high-voltage distribution unit 402 that is configured to provide power at high voltages to peripheral modules (e.g., peripheral modules in a vehicle). The first high-voltage power supply 410 is configured to provide power to the heater module 404. In this example, the high-voltage distribution unit 402 also includes a second high-voltage power supply 412. The second high-voltage power supply 412 is configured to provide power to the compressor module 406.

For example, the high-voltage distribution unit 402 may house the first high-voltage power supply 410, the second high-voltage power supply 412, and the continuity detection circuit 460.

The system 400 includes a first high-voltage cable including a first conductor 440 connected to the first high-voltage power supply 410 and a first shielding 450 that encircles the first conductor 440. For example, the first high-voltage cable may be a coaxial cable with the first conductor 440 as an inner, central conductor and the first shielding 450 as a concentric conducting shield that is separated from the first conductor 440 by a concentric dielectric insulator. The first high-voltage cable may also include a protective outer sheath (e.g., a plastic jacket) that encircles the first shielding 450. For example, the first shielding 450 may be made of copper or aluminum tape or conducting polymer. The first shielding 450 may act as a Faraday cage to reduce electromagnetic radiation. In this example, the first conductor 440 is connected to a positive terminal of the first high-voltage power supply 410 in the high-voltage distribution unit 402.

The system 400 includes a second high-voltage cable including a second conductor 442 connected to the first high-voltage power supply 410 and a second shielding 452 that encircles the second conductor 442. In this example, the second conductor 442 is connected to a negative terminal of the first high-voltage power supply 410 in the high-voltage distribution unit 402. In some implementations (not shown in FIG. 4), the second shielding 452 may also be connected to the continuity detection circuit 460, which may also be used to individually monitor the electrical connection of the second high-voltage cable in the same way it monitors the electrical connection of the first high-voltage cable using the first shielding 450. In some implementations (not shown in FIG. 4), a single shielding (e.g., similar to the first shielding 450) may encircle both the first conductor 440 and the second conductor 420. This single shielding that is shared by the first conductor 440 and the second conductor 420 may be used for monitoring the connection in the same way the first shielding 450 is used monitor the connection of the first high-voltage cable between the high-voltage distribution unit 402 and the heater module 404.

The first high-voltage cable and the second high-voltage cable may be used to connect the high-voltage distribution unit 402 to the heater module 404. When these cables are properly connected, the first conductor 440 and the second conductor 442 may bear current to and from the heater module 404 to supply electrical power to the heater module 404.

Similarly, the system 400 includes a third high-voltage cable including a third conductor 444 connected to the second high-voltage power supply 412 and a third shielding 454 that encircles the third conductor 444. The system 400 includes a fourth high-voltage cable including a fourth conductor 446 connected to the second high-voltage power supply 412 and a fourth shielding 456 that encircles the fourth conductor 446. In this example, the third conductor 444 is connected to a positive terminal and the fourth conductor 446 is connected to a negative terminal of the second high-voltage power supply 412 in the high-voltage distribution unit 402. The third high-voltage cable and the fourth high-voltage cable may be used to connect the high-voltage distribution unit 402 to the compressor module 406. When these cables are properly connected, the third conductor 444 and the fourth conductor 446 may bear current to and from the compressor module 406 to supply electrical power to the compressor module 406.

The system 400 includes a continuity detection circuit 460 connected to the first shielding 450. The high-voltage power supply 412 is part of a vehicle including a chassis that is coupled to a ground node 474 of the continuity detection circuit 460 and the continuity detection circuit 460 is connected to the shielding 450 at a first end of the high-voltage cable and the shielding 450 is coupled to the chassis at a second end of the high-voltage cable. The continuity detection circuit 460 may be configured to drive current through the shielding 450 that returns via the chassis. In this example, the shielding 450 is coupled to the chassis via a resistor 480 in a load module (i.e., the heater module 404) attached to the second end of the high-voltage cable. For example, the first shielding 450 may be connected with the continuity detection circuit 460 as described in FIG. 5. The continuity detection circuit 460 may have any of a variety of topologies for continuity detection. For example, the continuity detection circuit 460 may include a low-voltage current source that drives current through the first shielding 450 and a high-impedance voltmeter configured to measure the voltage of this shielding 450. In some implementations, a general-purpose input/output (GPIO) pin of an integrated circuit is configured as part of the continuity detection circuit 460 to supply current or voltage that are applied to the first shielding 450 and/or a GPIO pin is configured as part of the continuity detection circuit 460 to measure voltage or current that flows through the first shielding 450. When the expected current is found to flow normally through the first shielding 450 and the continuity detection circuit 460, the continuity detection circuit 460 determines that the first high-voltage cable is properly attached between the high-voltage distribution unit 402 and the heater module 404. When an interruption in this expected current flow through the first shielding 450 is detected by the continuity detection circuit 460, then the continuity detection circuit 460 determines that an error condition has manifested on the first shielding 450. For example, a high-voltage connector that attaches the first shielding 450 and/or the second shielding 452 to the high-voltage distribution unit 402 or to the heater module 404 may become disconnected from a mated connecter, which may be detected as an error or interruption condition by the continuity detection circuit 460. For example, the first shielding 450 may become cut or severed somewhere along its length, which may be detected as an error or interruption condition by the continuity detection circuit 460.

For example, the continuity detection circuit 460 may be configured to detect states including an open circuit state and a state indicating a short circuit of the shielding 450 to the chassis. In some implementations, the continuity detection circuit 460 includes a high-impedance voltage meter in parallel with a low-voltage voltage source (e.g., a 5 Volt source) that is in series with an output resistor between the ground node 474 and the first shielding 450. In this example topology, and with the resistor 480 coupling the first shielding 450 to the ground node 470 in the heater module 404, the reading of the voltage meter may be used to distinguish three cases: 1) 0 volts indicates a short circuit (e.g., caused bay vehicle impact that has severed the first cable and brought the first shielding 450 in contact with the chassis); 2) voltage equal to the voltage source output (e.g., 5 Volts) indicates an open circuit condition (e.g., due to cable connector of the first high-voltage cable becoming disconnected); or 3) an intermediate voltage (e.g., 2.5 Volts) from voltage division between the output resistor and the resistor 480 indicates normal operation and current flow through the first high-voltage cable to the heater module 404.

In either of these two fault scenarios (i.e., a cable is cut or a cable becomes disconnected), the controller 430 of the high-voltage distribution unit 402 may be configured to take a corrective action responsive to the continuity detection circuit 460 detecting that a fault condition has occurred. In some implementations, the controller 430 may be configured to stop the flow of high-voltage current from the first high-voltage power supply 410 through the first conductor 440 responsive to detection of a disruption of continuity by the continuity detection circuit 460. For example, the controller 430 may include a safety circuit configured to, responsive to detection of a disruption of continuity by the continuity detection circuit 460, stop current flow from the high-voltage power supply 410 through the first conductor 440. In some implementations, short circuit conditions and open circuit conditions may be distinguished and handle differently. For example, and open circuit may trigger an immediate shutdown of the power supply for an implicated load module, while a short circuit condition may trigger an immediate shutdown of all adjacent power supplies, since it might be a vehicle crash scenario. For example, and open circuit may trigger a warning message and/or activation of maintenance needed indicator, while a short circuit condition may trigger an immediate shutdown of one or more power supplies or other systems.

In some implementations, the continuity detection circuit 460 has direct current isolation from a ground node of the high-voltage power supply 410. For example, the continuity detection circuit 460 and the first shielding 450 may be connected as shown in the example system 500 of FIG. 5.

Similarly, the continuity detection circuit 460 may be connected to the third high-voltage cable to monitor electrical connection status between the high-voltage distribution unit 402 and the compressor module 406. The continuity detection circuit 460 may be configured to detect either of the two fault scenarios (i.e., a cable is cut or a cable becomes disconnected) and the controller 430 of the high-voltage distribution unit 402 may be configured to take a corrective action responsive to the continuity detection circuit 460 detecting that a fault condition has occurred along the third high-voltage cable. In some implementations, the controller 430 may be configured to stop the flow of high-voltage current from the second high-voltage power supply 412 through the third conductor 444 responsive to detection of a disruption of continuity by the continuity detection circuit 460. For example, the controller 430 may include a safety circuit configured to, responsive to detection of a disruption of continuity by the continuity detection circuit 460, stop current flow from the high-voltage power supply 412 through the third conductor 444.

In some implementations (not shown in FIG. 4), the continuity detection circuit 460 may be housed in a load module (e.g., the heater module 404 or the compressor module 406) rather than in the high-voltage distribution unit 402. For example, a system may include a high-voltage distribution unit that houses the high-voltage power supply (e.g., the high-voltage power supply 410), where the high-voltage distribution unit is attached to a first end of the first high-voltage cable; and a load module that houses a continuity detection circuit (e.g., the continuity detection circuit 460), where the load module is attached to a second end of the first high-voltage cable.

The system 400 may provide advantages over conventional High Voltage Interlock Loop (HVIL) systems. For example, cuts to a cable or other cable damage may be detected as fault conditions using the continuity detection circuit 460 with the first shielding 450. For example, the use of additional wiring to high-voltage connectors that attach the high-voltage cables that is typical of traditional HVIL systems may be avoided. For example, the system 400 may enable individual monitoring of load modules, such as the heater module 404 or the compressor module 406. For example, the system 400 may distinguish between open circuit and short circuit conditions, which may enable different handling of different types of disruptions of an electrical connection through a cable by selecting different actions in response.

Figure 5:
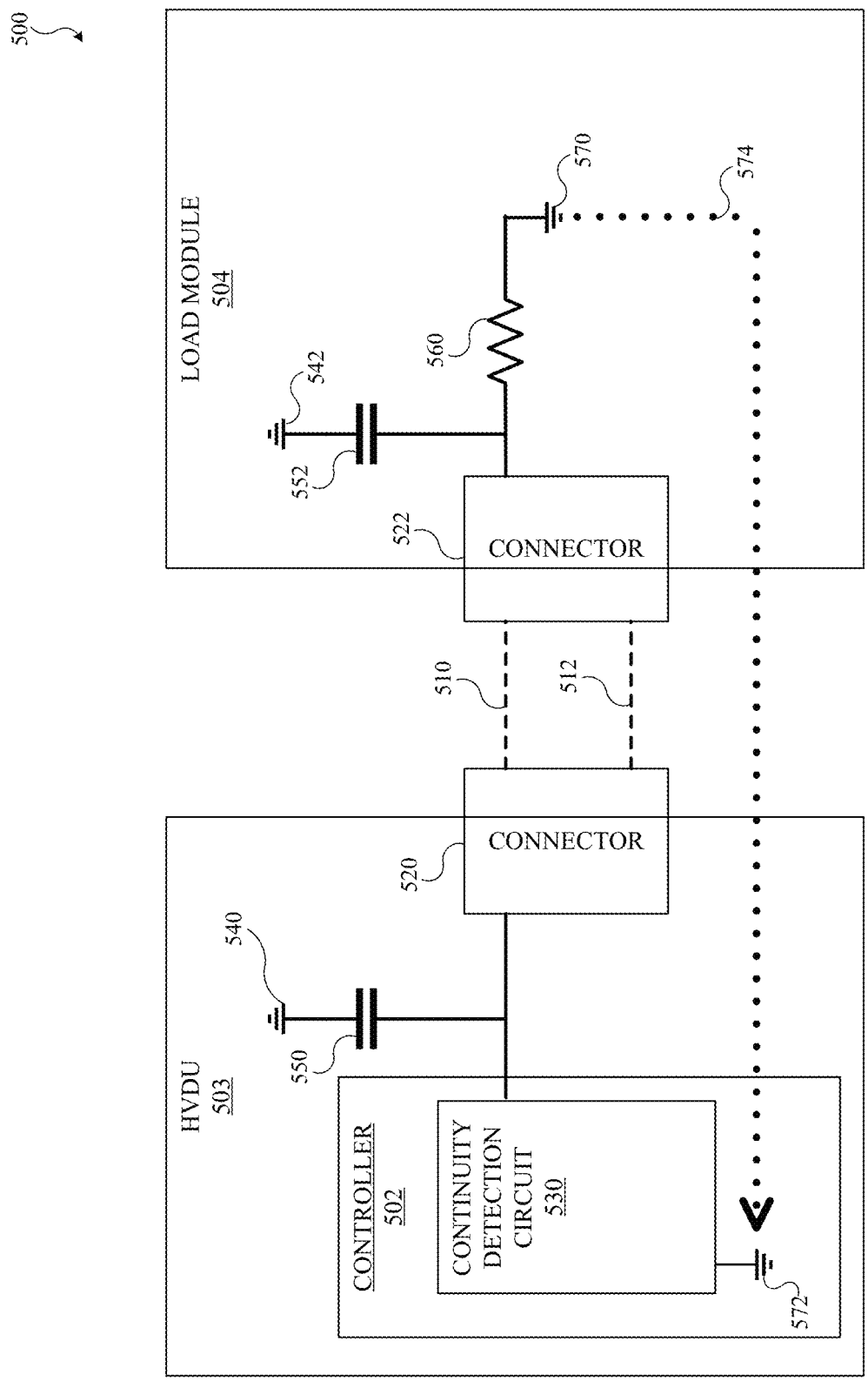
FIG. 5 is a circuit diagram of an example of a system for electrical connection monitoring using shielding of a single cable to and a current return path through a chassis.

FIG. 5 is a circuit diagram of an example of a system 500 for electrical connection monitoring using shielding of a single cable to and a current return path through a chassis. The system 500 includes a controller 502 in a high-voltage distribution unit 503 in a vehicle (e.g., a car or a truck) and a load module 504 that receives electrical power from the high-voltage distribution unit 503. The high-voltage distribution unit 503 and the load module 504 are connected via high-voltages cables that include a first shielding 510 and a second shielding 512. At the high-voltage distribution unit 503, a first connector 520 attaches a first end of high-voltage cables to the high-voltage distribution unit 503. At the load module 504, a second connector 522 attaches a second end of high-voltage cables to the load module 504. The controller 502 includes a continuity detection circuit 530 (e.g., the continuity detection circuit 460) that is connected, via the first connector 520, to the first shielding 510 to monitor the electrical connection status for the load module 504. The first shielding 510 is coupled via the first connector 520 and an alternating current coupling capacitor 550 to a ground node 540 in the high-voltage distribution unit 503. In the load module 504, the first shielding 510 is coupled via the second connector 522 and an alternating current coupling capacitor 552 to a ground node 542 in the load module 504. For example, the alternating current coupling capacitors 550 and 552 may serve to reduce radiation from the first shielding 510 and prevent or mitigate electromagnetic interference. For example, the system 500 may be used to implement the process 700 of FIG. 7.

For example, the first connector 520 may include a high-voltage harness connector mated with a high-voltage header connector. The first connector 520 may be configured to internally keep the first shielding 510 isolated from the second shielding 512. For example, the first connector 520 may include the high-voltage harness connector 860 of FIG. 8. For example, the second connector 522 may include a high-voltage harness connector mated with a high-voltage header connector. The second connector 522 may be configured to internally keep the first shielding 510 isolated from the second shielding 512. For example, the second connector 522 may include the high-voltage harness connector 860 of FIG. 8. In some implementations (not shown in FIG. 5), a single shielding (e.g., similar to the first shielding 510) may encircle multiple conductors used to convey power to the load module 504 and the second shielding 512 may be omitted. For example, the single shielding may be part of a multi-core cable. This single shielding that is shared may be used for monitoring the connection in the same way the first shielding 510 is used monitor the connection of the first high-voltage cable between the high-voltage distribution unit 503 and the load module 504.

For example, the ground node 540 of the high-voltage distribution unit 503 may be a ground node of a power supply of the high-voltage distribution unit 503. In some implementations, the continuity detection circuit 530 may have direct current isolation from a ground node of the high-voltage power supply (e.g., the high-voltage power supply 110). For example, the alternating current coupling capacitor 550 may couple the first shielding 510 to a ground node 540 (e.g., a ground node of the high-voltage power supply). In some implementations, the system 500 is part a vehicle and the ground node 542 of the load module 504 is connected to the ground node 540 of the high-voltage distribution unit 503 via a chassis of the vehicle.

Conductors in the high-voltage distribution unit 503 that connect, via the first connector 520, the first shielding 510 to the continuity detection circuit 530 and the respective alternating current coupling capacitor 550 may be, for example, wires or traces on a printed circuit board (PCB). As described in relation to the continuity detection circuit 460 above, the continuity detection circuit 530 may have a variety of topologies. For example, the continuity detection circuit 530 may include a current sensor or voltage sensor for monitoring the circuit continuity around a loop that includes the continuity detection circuit 530 and the first shielding 510 and a current return path 574 through the chassis of the vehicle. The first shielding 510 is also coupled to a ground node 570 in the load module 504 via a resistor 560. The ground node 570 may be connected to the vehicle chassis and, through the chassis, to ground node 572 in the high-voltage distribution unit 503. In some implementations (not shown in FIG. 5), the resistor 560 may be omitted from the system 500 and the first shielding 510 may be connected directly to the ground node 570.

Figure 6:
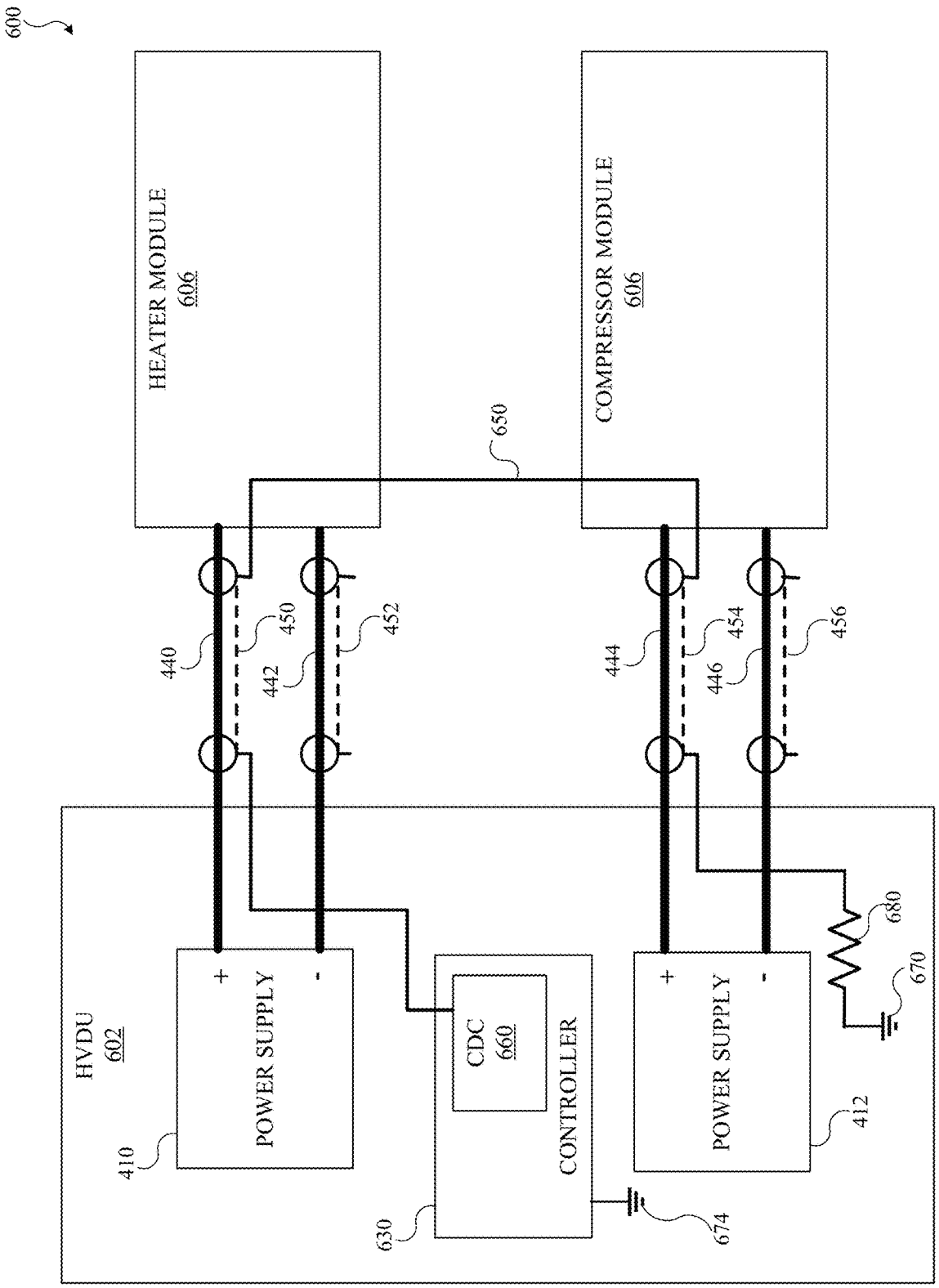
FIG. 6 is a circuit diagram of an example of a system for electrical connection monitoring using shielding of cables connected in series to monitor multiple peripheral modules.

FIG. 6 is a circuit diagram of an example of a system 600 for electrical connection monitoring using shielding of cables connected in series to monitor multiple peripheral modules. The system 600 includes a high-voltage distribution unit (HVDU) 602 that is connected to two peripheral or load modules—the heater module 604 and the compressor module 606—via high-voltage cables. The high-voltage distribution unit 602 includes the first high-voltage power supply 410 and the second high-voltage power supply 412. The high-voltage distribution unit 602 includes a controller 630 of the high-voltage distribution unit 602. The system 600 includes the first high-voltage cable including the first conductor 440 connected to the first high-voltage power supply 410 and the first shielding 450 that encircles the first conductor 440. The system 400 includes the second high-voltage cable including the second conductor 442 connected to the first high-voltage power supply 410 and the second shielding 452 that encircles the second conductor 442. The system 600 includes the third high-voltage cable including the third conductor 444 connected to the second high-voltage power supply 412 and the third shielding 454 that encircles the third conductor 444. The system 600 includes the fourth high-voltage cable including the fourth conductor 446 connected to the second high-voltage power supply 412 and the fourth shielding 456 that encircles the fourth conductor 446. The system 600 includes a continuity detection circuit 660 connected to the first shielding 450. The first shielding 450 is connected to the third shielding 454 by a wire 650 that extends between the heater module 604 and the compressor module 606, the third shielding 454 is coupled to a ground node 670 in the high-voltage distribution unit 602 via a resistor 680, and the ground node 670 is connected to the ground node 674 of the controller 630 (e.g., via the vehicle chassis) to form a loop with the continuity detection circuit 660 that uses the ground node 674. This loop includes shielding for connections to multiple load modules arranged in series. The system 600 may be configured to monitor connection status for the cables of this loop, including interruptions caused by cuts or other damage to the cables themselves and their connections to the high-voltage distribution unit 602 and their respective peripheral module. In some implementations, the system 600 is part a vehicle. For example, the system 600 may be used to implement the process 700 of FIG. 7.

Comparing the system 600 to the system 400 of FIG. 4, the loop being monitored for continuity is expanded to include one or more additional shieldings (e.g., the third shielding 454), of additional high-voltage cables, that are connected in series to form the loop with the continuity detection circuit. These additional shieldings may be associated with connections to additional load modules (e.g., the compressor module 406).

For example, the high-voltage distribution unit 602 may house the first high-voltage power supply 410, the second high-voltage power supply 412, and the continuity detection circuit 660.

The system 600 includes a continuity detection circuit 660 connected to the first shielding 450. The first shielding 450 is connected to the third shielding 454 by a wire 650 that extends between different load modules (i.e., the heater module 604 and the compressor module 606), the third shielding 454 is coupled to a ground node 670 in the high-voltage distribution unit 602 via a resistor 680, and the ground node 670 is connected to the ground node 674 of the controller 630 (e.g., via the vehicle chassis) to form a loop with the continuity detection circuit 660 that uses the ground node 674. The third shielding 454 is connected in series with the first shielding 450, i.e., via the wire 650. For example, a conductor in the high-voltage distribution unit 602 that connects the third shielding 454 to the resistor 680 may include a trace on printed circuit board and/or a wire in the high-voltage distribution unit 602. This conductor may connect to the second shielding 452 and the third shielding 454 through respective connectors at the high-voltage distribution unit 602 (e.g., as described in relation the first connector 520 of FIG. 5). The continuity detection circuit 660 may have any of a variety of topologies for continuity detection. For example, the continuity detection circuit 660 may include a low-voltage current source that drives current through the loop that includes the first shielding 450 and the third shielding 454. For example, the continuity detection circuit 660 may also include a high-impedance voltmeter configured to measure the current flowing through this loop. In some implementations, a general-purpose input/output (GPIO) pin of an integrated circuit is configured as part of the continuity detection circuit 660 to supply current or voltage that are applied to the loop and/or a GPIO pin is configured as part of the continuity detection circuit 660 to measure current or voltage that flow through this loop. When the expected current is found to flow through the loop including the shielding for cables attached to multiple load modules, the continuity detection circuit 660 determines that the first high-voltage cable, the second high-voltage cable, the third high-voltage cable, and the fourth high-voltage cable are properly attached between the high-voltage distribution unit 602 and their respective load modules (e.g., the heater module 604 and the compressor module 606). When an interruption in this expected current flow through this loop is detected by the continuity detection circuit 660, then the continuity detection circuit 660 determines that an error condition has manifested on the first shielding 450 and/or the third shielding 454. For example, a high-voltage connector that attaches the first shielding 450 and/or the second shielding 452 to the high-voltage distribution unit 602 or to the heater module 604 may become disconnected from a mated connecter, which may be detected as an error or interruption condition by the continuity detection circuit 660. For example, a high-voltage connector that attaches the third shielding 454 and/or the fourth shielding 456 to the high-voltage distribution unit 602 or to the compressor module 606 may become disconnected from a mated connecter, which may be detected as an error or interruption condition by the continuity detection circuit 660. For example, the first shielding 450 or the third shielding 454 may become cut or severed somewhere along their length, which may be detected as an error or interruption condition by the continuity detection circuit 660.

In either of these two fault scenarios (i.e., a cable is cut or a cable becomes disconnected), the controller 630 of the high-voltage distribution unit 602 may be configured to take a corrective action responsive to the continuity detection circuit 660 detecting that a fault condition has occurred. In some implementations, the controller 630 may be configured to stop the flow of high-voltage current from the first high-voltage power supply 410 through the first conductor 440 and the second conductor 442 and stop the flow of high-voltage current from the second high-voltage power supply 412 through the third conductor 444 and the fourth conductor 446 responsive to detection of a disruption of continuity by the continuity detection circuit 660. For example, the controller 630 may include a safety circuit configured to, responsive to detection of a disruption of continuity by the continuity detection circuit 660, stop current flow from the high-voltage power supply 410 through the first conductor 440.

For example, the high-voltage power supply 410 may be part of a vehicle (e.g., a car or a truck) including a chassis that is coupled to the ground node 674 of the continuity detection circuit 660. In some implementations, the continuity detection circuit 660 has direct current isolation from a ground node of the high-voltage power supply 410. For example, the continuity detection circuit 660 and the first shielding 450, the second shielding 452, the third shielding 454, and the fourth shielding 456 may be coupled to one or more ground nodes via capacitors as shown in the example system 200 of FIG. 2.

Figure 7:
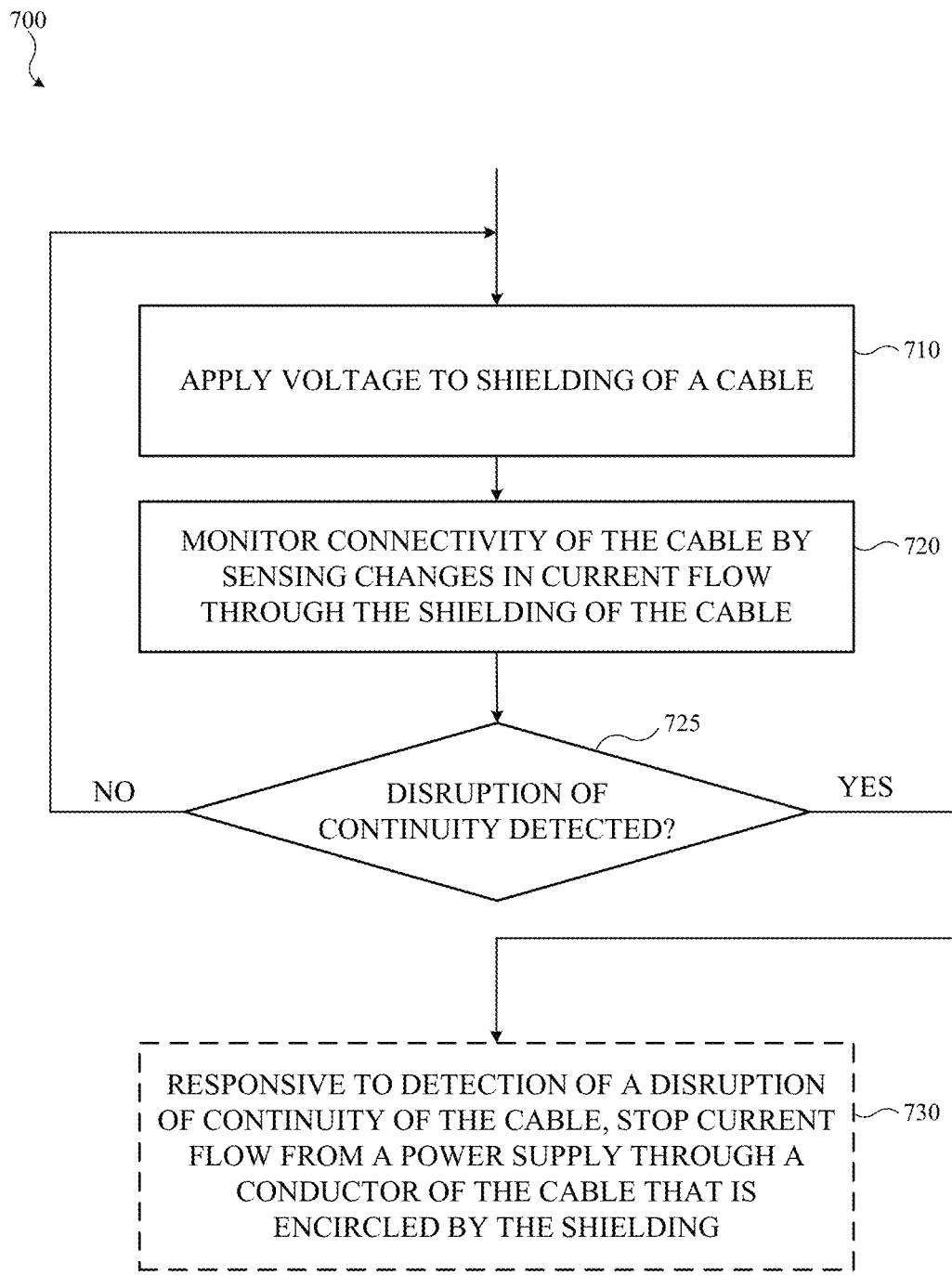
FIG. 7 is a flow chart of a process for electrical connection monitoring using cable shielding.

FIG. 7 is a flow chart of a process 700 for electrical connection monitoring using cable shielding. The process 700 includes applying 710 a voltage to a shielding of a cable; monitoring 720 connectivity of the cable by sensing changes in current flow through the shielding of the cable; when (at step 725) a disruption of continuity is detected, then, responsive to detection of a disruption of continuity of the cable, stopping 730 current flow from a power supply through a conductor of the cable that is encircled by the shielding. The process 700 may provide advantages over techniques for electrical connection monitoring using conventional High Voltage Interlock Loop (HVIL) systems. For example, cuts to a cable or other cable damage may be detected as fault conditions using a continuity detection circuit with the shielding of one or more cables. For example, the use of additional wiring to high-voltage connectors that attach the high-voltage cables that is typical of traditional HVIL systems may be avoided. For example, the process 700 may enable individual monitoring of load modules. In some implementations, the process 700 may distinguish between open circuit and short circuit conditions, which may enable different handling of different types of disruptions of an electrical connection through a cable by selecting different actions in response. For example, the process 700 may be implanted using the system 100 of FIG. 1A. For example, the process 700 may be implanted using the system 200 of FIG. 2. For example, the process 700 may be implanted using the system 300 of FIG. 3. For example, the process 700 may be implanted using the system 400 of FIG. 4. For example, the process 700 may be implanted using the system 500 of FIG. 5. For example, the process 700 may be implanted using the system 600 of FIG. 6.

The process 700 includes applying 710 a voltage to a shielding of a cable. The voltage may be a relatively low voltage in a system including the cable. In some implementations, the voltage applied to the shielding is at least a factor of ten smaller than high voltage applied to a conductor of the cable that is encircled by the shielding. For example, the shielding of the cable may be connected to a continuity detection circuit, which may include a low-voltage current source or voltage source that is configured to induce a voltage and/or a current in the shielding. For example, the induced voltage may be a low voltage (e.g., 5 volts or lower). For example, the induced voltage in the shielding may be a direct current (DC) voltage or a low-frequency alternating current (AC) voltage. For example, this may result in an expected voltage and/or current in the shielding as long as the desired arrangement of cables, including at least the cable in question, is maintained between a device housing the continuity detection circuit (e.g., a high-voltage distribution unit) and one or more peripheral or load modules.

The process 700 includes monitoring 720 connectivity of the cable by sensing changes in current flow through the shielding of the cable. For example, when an indication of current flow through the shielding (e.g., a measured current or a measured voltage in a continuity detection circuit connected to the shielding) deviates from an expected value by more than a threshold amount for more than a threshold period of time, a disruption of continuity may be detected. For example, a disruption of continuity may be caused by the cable becoming disconnected from a module (e.g., disconnected from a high-voltage distribution unit or a load module) it was attached to. For example, a disruption of continuity may be caused by the cable being cut or otherwise damage at some point along its length even while the harness connectors at both ends of the cable remain attached to their respective mated header connectors. In some implementations, monitoring 720 connectivity of the cable may include distinguishing between different types of disruptions of continuity. For example, monitoring 720 connectivity of the cable may include detecting a state from among a set of states including an open circuit state and a state indicating a short circuit of the shielding to a chassis of a vehicle. For example, the different types of disruptions of continuity may be distinguished as described in relation FIGS. 4 and 5.

If (at step 725) a disruption of continuity is not detected, then the cable is determined to be arranged about operating normally in a system including the cable and the application of voltage to the shielding 710 and monitoring 720 may continue.

If (at step 725) a disruption of continuity is not detected, then the process 700 includes, responsive to detection of a disruption of continuity of the cable, stopping 730 current flow from a power supply through a conductor of the cable that is encircled by the shielding. For example, current flow from the power supply may be stopped 730 by disabling or shutting down the power supply. In some implementations, the current flow may be stopped 730 by opening a switch that was connecting the conductor of the cable to the power supply. In some implementations, the action taken in response to detection of a disruption of continuity depends on the type of disruption that I detected. For example, where an open circuit condition is the type of disruption detected, the current flow to a single load module implicated by the disruption may be stopped 730. For example, where a short circuit condition is the type of disruption detected, the current flow to many adjacent load modules in a vehicle may be stopped 730. This action may be taken because a short circuit condition may be more likely to result from accident that has damaged the vehicle and cut into the cable, bringing the shielding into contact with a vehicle chassis.

Step 730 is optional and may be omitted from the process 700 in some implementations. For example, connectivity monitoring 720 using the shielding of a cable may be applied to cables electrical connection via cable in systems that use low voltages and present significantly lower safety hazards (e.g., monitoring 720 connectivity of an Ethernet cable or a low-voltage shielded alternating current (AC) cable). In some implementations, actions taken responsive to detection of a disruption of continuity of the cable, may include presenting a warning message or a maintenance needed prompt to user via a user interface of the system.

Figure 8:
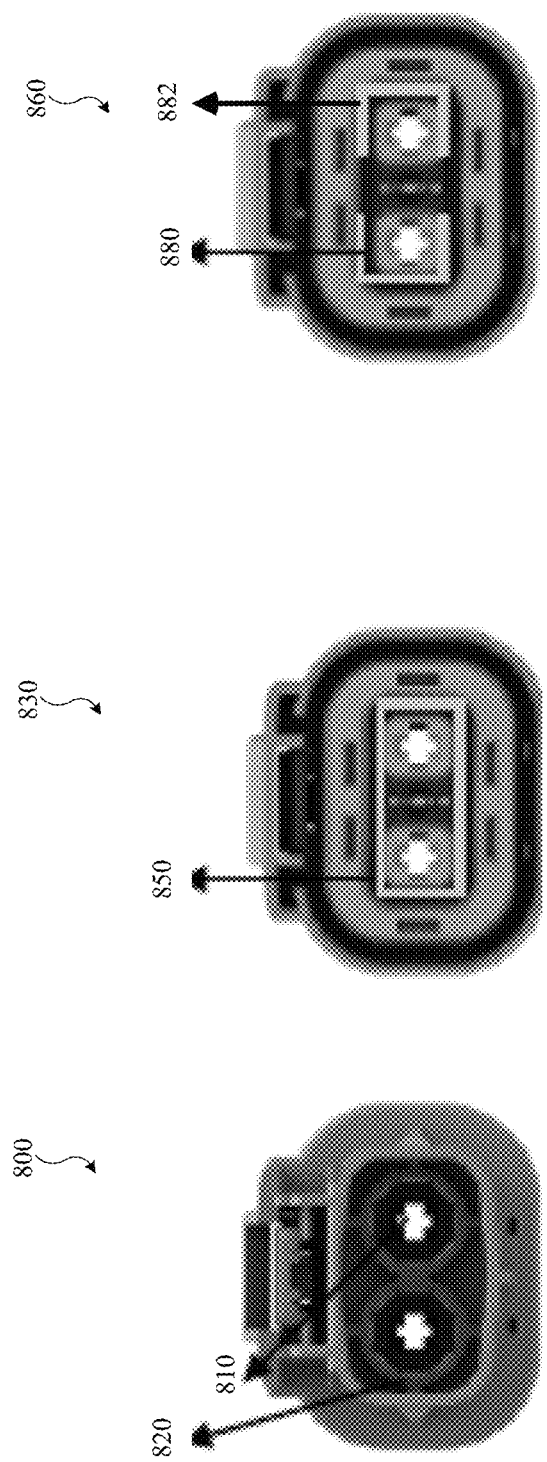
FIG. 8 shows illustrations of examples of electrical cable connectors.

FIG. 8 shows illustrations of examples of electrical cable connectors. The first connector 800 is a high-voltage harness connector illustrated from a perspective looking at the cable side of the connector 800. The first connector includes electrically isolated shielding terminations 810 and 820 for a pair of coaxial cables that will be attached to the first connector 800. The first shielding termination 810 is electrically isolated from the second shielding termination 820 in the sense that the terminations do not directly connect to each other, although in some implementations they may be electrically connected by another part (e.g., a jumper) of the first connector 800 or another component of a larger system in which the first connector 800 is used.

A second connector 830 is illustrated from a perspective looking at the module/terminal side of the connector 830. The second connector 830 is a high-voltage harness connector with a continuous metal plate 850 that electrically connects two shielding terminations for a pair of coaxial cables that will be attached to the second connector 830. For example, the second connector 830 may be used as a loop connector to connect a first shielding and a second shielding attached to the second connector 830.

A third connector 860 is illustrated from a perspective looking at the module/terminal side of the connector 860. The third connector 860 is a high-voltage harness connector with isolated metal plates 880 and 882 that connect to respective shielding terminations for a pair of coaxial cables that will be attached to the third connector 860. For example, the third connector 860 may be used as an individual isolation connector to keep a first shielding and a second shielding attached to the third connector 860 isolated as they are connected through the third connector 860 to a high-voltage distribution unit or a load module.

Figure 9:
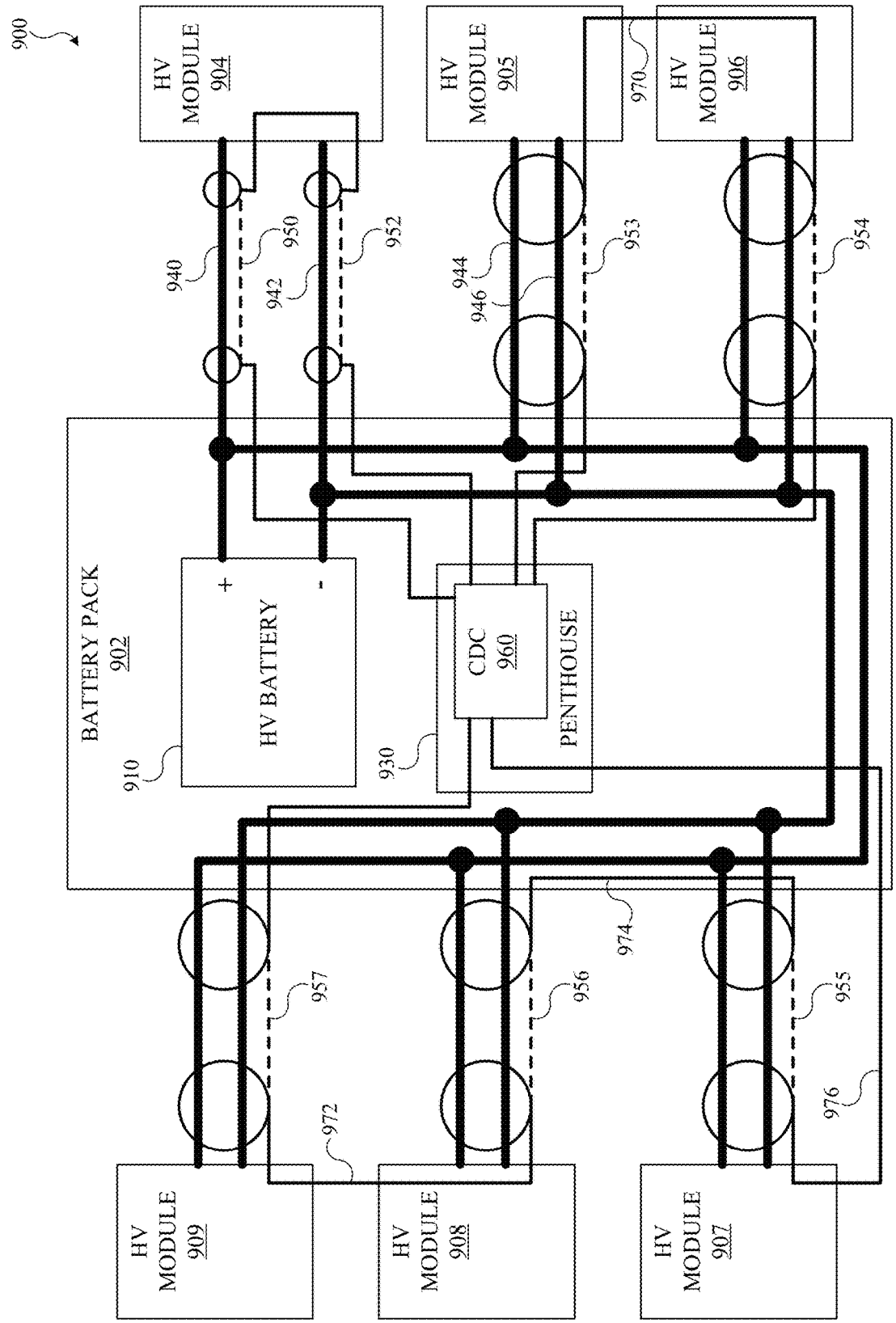
FIG. 9 is a circuit diagram of an example of a system for electrical connection monitoring using cable shielding.

FIG. 9 is a circuit diagram of an example of a system 900 for electrical connection monitoring using cable shielding. The system 900 includes a battery pack 902 that is connected to six peripheral or load modules (903, 904, 905, 906, 907, 908, and 909) via high-voltage cables. The battery pack 902 includes a high-voltage battery 910. The battery pack 902 includes a penthouse 930 of the battery pack 902. The system 900 includes a first high-voltage cable including a first conductor 940 connected to the high-voltage battery 910 and a first shielding 950 that encircles the first conductor 940. The system 900 includes a second high-voltage cable including a second conductor 942 connected to the high-voltage battery 910 and a second shielding 952 that encircles the second conductor 942. The system 900 includes a third high-voltage cable including a third conductor 944 and a fourth conductor 946 connected to the high-voltage battery 910 and a third shielding 953 that encircles the third conductor 944 and the fourth conductor 946. For example, the third high-voltage cable may be a multi-core cable. The system 900 includes a fourth high-voltage cable (e.g., a multi-core cable) including a pair of conductors connected to the high-voltage battery 910 and a fourth shielding 954 that encircles this pair of conductors. The system 900 includes a fifth high-voltage cable (e.g., a multi-core cable) including a pair of conductors connected to the high-voltage battery 910 and a fifth shielding 955 that encircles this pair of conductors. The system 900 includes a sixth high-voltage cable (e.g., a multi-core cable) including a pair of conductors connected to the high-voltage battery 910 and a sixth shielding 956 that encircles this pair of conductors. The system 900 includes a seventh high-voltage cable (e.g., a multi-core cable) including a pair of conductors connected to the high-voltage battery 910 and a seventh shielding 957 that encircles this pair of conductors. The system 900 includes a continuity detection circuit 960 connected to the first shielding 950 and to the second shielding 952. The second shielding 952 is connected to the first shielding 950 at a first high-voltage module 904 to form a loop with the continuity detection circuit 960. The continuity detection circuit 960 is connected to the third shielding 953 and to the fourth shielding 954. The fourth shielding 954 is connected to the third shielding 953 via a wire 970 extending between a second high-voltage module 905 and a third high-voltage module 906 to form a loop with the continuity detection circuit 960. The continuity detection circuit 960 is connected to the seventh shielding 957. The seventh shielding 957 is connected to the sixth shielding 956 via a wire 972 extending between a sixth high-voltage module 909 and a fifth high-voltage module 908, the sixth shielding 956 is connected to the fifth shielding 955 via a wire 974 in the battery pack 902, and the fifth shielding 955 is connected to the continuity detection circuit 960 via a wire 976 extending between a fourth high-voltage module 907 and the battery pack 902 to form a loop with the continuity detection circuit 960. The system 900 may be configured to monitor connection status for the cables of a loop, including interruptions caused by cuts or other damage to the cables themselves and their connections to the battery pack 902 and their respective peripheral module. In some implementations, the system 900 is part of a vehicle. For example, the system 900 may be used to implement the process 700 of FIG. 7.

The system 900 includes a high-voltage battery 910. The high-voltage battery 910 includes a positive terminal and a negative terminal. In some implementations, the high-voltage battery 910 provides power at a direct current voltage greater than 1500 Volts. The high-voltage battery 910 is part of a battery pack 902 that is configured to provide power at high voltages to peripheral modules (e.g., peripheral modules in a vehicle). The high-voltage battery 910 is configured to provide power to the first high-voltage module 904, the second high-voltage module 905, the third high-voltage module 906, the fourth high-voltage module 907, the fifth high-voltage module 908, and the sixth high-voltage module 909 in parallel. For example, the battery pack 902 may house the high-voltage battery 910 and the continuity detection circuit 960.

The system 900 includes a first high-voltage cable including a first conductor 940 connected to the high-voltage battery 910 and a first shielding 950 that encircles the first conductor 940. For example, the first high-voltage cable may be a coaxial cable with the first conductor 940 as an inner, central conductor and the first shielding 950 as a concentric conducting shield that is separated from the first conductor 940 by a concentric dielectric insulator. The first high-voltage cable may also include a protective outer sheath (e.g., a plastic jacket) that encircles the first shielding 950. For example, the first shielding 950 may be made of copper or aluminum tape or conducting polymer. The first shielding 950 may act as a Faraday cage to reduce electromagnetic radiation. In this example, the first conductor 940 is connected to a positive terminal of the high-voltage battery 910 in the battery pack 902.

The system 900 includes a second high-voltage cable including a second conductor 942 connected to the high-voltage battery 910 and a second shielding 952 that encircles the second conductor 942. For example, the second high-voltage cable may be a coaxial cable with the second conductor 942 as an inner, central conductor and the second shielding 952 as a concentric conducting shield that is separated from the second conductor 942 by a concentric dielectric insulator. The first high-voltage cable may also include a protective outer sheath (e.g., a plastic jacket) that encircles the second shielding 952. For example, the second shielding 952 may be made of copper or aluminum tape or conducting polymer. The second shielding 952 may act as a Faraday cage to reduce electromagnetic radiation. In this example, the second conductor 942 is connected to a negative terminal of the high-voltage battery 910 in the battery pack 902.

The first high-voltage cable and the second high-voltage cable may be used to connect the battery pack 902 to the first high-voltage module 904. When these cables are properly connected, the first conductor 940 and the second conductor 942 may bear current to and from the first high-voltage module 904 to supply electrical power to the first high-voltage module 904.

The system 900 includes a third high-voltage cable including a third conductor 944 and a fourth conductor 946 connected to the high-voltage battery 910 and a third shielding 953 that encircles the third conductor 944 and the fourth conductor 946. For example, the third high-voltage cable may be a multi-core cable with the third conductor 944 and the fourth conductor 946 as an inner conductors and the third shielding 953 as a conducting shield that is separated from the third conductor 944 and the fourth conductor 946 by one or more dielectric insulators. The third high-voltage cable may also include a protective outer sheath (e.g., a plastic jacket) that encircles the third shielding 953. For example, the third shielding 953 may be made of copper or aluminum tape or conducting polymer. The third shielding 953 may act as a Faraday cage to reduce electromagnetic radiation. In this example, the third conductor 944 is connected to a positive terminal and the fourth conductor 946 is connected to a negative terminal of the high-voltage battery 910 in the battery pack 902. The third high-voltage cable may be used to connect the battery pack 902 to the second high-voltage module 905. When this cable is properly connected, the third conductor 944 and the fourth conductor 946 may bear current to and from the second high-voltage module 905 to supply electrical power to the second high-voltage module 905.

Similarly, the system 900 includes a fourth high-voltage cable including a fourth shielding 954 that connects the battery pack 902 to the third high-voltage module 906; a fifth high-voltage cable including a fifth shielding 955 that connects the battery pack 902 to the fourth high-voltage module 907; a sixth high-voltage cable including a sixth shielding 956 that connects the battery pack 902 to the fifth high-voltage module 908; and a seventh high-voltage cable including a seventh shielding 957 that connects the battery pack 902 to the sixth high-voltage module 909.

The system 900 includes a continuity detection circuit 960 connected to the first shielding 950 and to the second shielding 952. The second shielding 952 is connected to the first shielding 950 to form a loop with the continuity detection circuit 960. For example, the second shielding 952 may be connected to the first shielding 950 via a jumper in a connector that attaches the first high-voltage cable and the second high-voltage cable to the first high-voltage module 904. In some implementations, the second shielding 952 may be connected to the first shielding 950 via a wire inside the first high-voltage module 904. For example, the second shielding 952 may be connected to the first shielding 950 in the loop with the continuity detection circuit 960 as described in FIG. 2. The continuity detection circuit 960 may have any of a variety of topologies for continuity detection. For example, the continuity detection circuit 960 may include a low-voltage current source that drives current through the loop that includes the first shielding 950 and the second shielding 952 and a high-impedance voltmeter configured to measure the current flowing through this loop. In some implementations, a general-purpose input/output (GPIO) pin of an integrated circuit is configured as part of the continuity detection circuit 960 to supply current or voltage that are applied to the loop including the first shielding 950 and the second shielding 952 and/or a GPIO pin is configured as part of the continuity detection circuit 960 to measure voltage or current that flows through this loop. When the expected current is found to flow through the loop including the first shielding 950 and the second shielding 952 and the continuity detection circuit 960, the continuity detection circuit 960 determines that the first high-voltage cable and second high-voltage cable are properly attached between the battery pack 902 and the first high-voltage module 904. When an interruption in this expected current flow through this loop is detected by the continuity detection circuit 960, then the continuity detection circuit 960 determines that an error condition has manifested on the first shielding 950 and/or the second shielding 952. For example, a high-voltage connector that attaches the first shielding 950 and/or the second shielding 952 to the battery pack 902 or to the first high-voltage module 904 may become disconnected from a mated connecter, which may be detected as an error or interruption condition by the continuity detection circuit 960. For example, the first shielding 950 or the second shielding 952 may become cut or severed somewhere along their length, which may be detected as an error or interruption condition by the continuity detection circuit 960.

In either of these two fault scenarios (i.e., a cable is cut or a cable becomes disconnected), a controller of the battery pack 902 (e.g., in the penthouse 930) may be configured to take a corrective action responsive to the continuity detection circuit 960 detecting that a fault condition has occurred. In some implementations, the controller may be configured to stop the flow of high-voltage current from the high-voltage battery 910 through the first conductor 940 and the second conductor 942 responsive to detection of a disruption of continuity by the continuity detection circuit 960. For example, the controller may include a safety circuit configured to, responsive to detection of a disruption of continuity by the continuity detection circuit 960, stop current flow from the high-voltage battery 910 through the first conductor 940.

For example, the high-voltage battery 910 may be part of a vehicle (e.g., a car or a truck) including a chassis that is coupled to a ground node of the continuity detection circuit 960. In some implementations, the system 900 includes a high-voltage module connector that attaches the first high-voltage cable and the second high-voltage cable to a load module (e.g., the first high-voltage module 904), and a jumper in the high-voltage module connector that connects the first shielding 950 and the second shielding 952.

In some implementations, the continuity detection circuit 960 has direct current isolation from a ground node of the high-voltage battery 910. For example, the continuity detection circuit 960 and the first shielding 950 and the second shielding 952 may be connected as shown in the example system 200 of FIG. 2.

The continuity detection circuit 960 may be connected to the third high-voltage cable and the fourth high-voltage cable to form a second loop for monitoring electrical connection status between the battery pack 902 and the second high-voltage module 905 and the third high-voltage module 906. The fourth shielding 954 is connected to the third shielding 953 via a wire 970 extending between the second high-voltage module 905 and the third high-voltage module 906 to form the second loop with the continuity detection circuit 960. The continuity detection circuit 960 may be configured to detect either of the two fault scenarios (i.e., a cable is cut or a cable becomes disconnected) and a controller of the battery pack 902 may be configured to take a corrective action responsive to the continuity detection circuit 960 detecting that a fault condition has occurred on the second loop. In some implementations, a controller of the battery pack 902 may be configured to stop the flow of high-voltage current from the high-voltage battery 910 through conductors of the third high-voltage cable and the fourth high-voltage cable responsive to detection of a disruption of continuity by the continuity detection circuit 960. For example, the controller may include a safety circuit configured to, responsive to detection of a disruption of continuity by the continuity detection circuit 960, stop current flow from the high-voltage battery 910 through the third conductor 944. Thus, the second loop may be used to jointly monitor the connections to the second high-voltage module 905 and the third high-voltage module 906 in series.

Similarly, the continuity detection circuit 960 may be connected to the seventh high-voltage cable to form a third loop for monitoring electrical connection status between the battery pack 902 and the fourth high-voltage module 907, the fifth high-voltage module 908, and the sixth high-voltage module 909. The seventh shielding 957 is connected to the sixth shielding 956 via a wire 972 extending between the sixth high-voltage module 909 and the fifth high-voltage module 908, the sixth shielding 956 is connected to the fifth shielding 955 via a wire 974 in the battery pack 902, and the fifth shielding 955 is connected to the continuity detection circuit 960 via a wire 976 extending between the fourth high-voltage module 907 and the battery pack 902 to form a third loop with the continuity detection circuit 960. The continuity detection circuit 960 may be configured to detect either of the two fault scenarios (i.e., a cable is cut or a cable becomes disconnected) and a controller of the battery pack 902 may be configured to take a corrective action responsive to the continuity detection circuit 960 detecting that a fault condition has occurred on the third loop. In some implementations, a controller of the battery pack 902 may be configured to stop the flow of high-voltage current from the high-voltage battery 910 through conductors of the fifth high-voltage cable, the sixth high-voltage cable, and the seventh high-voltage cable responsive to detection of a disruption of continuity by the continuity detection circuit 960. For example, the controller may include a safety circuit configured to, responsive to detection of a disruption of continuity by the continuity detection circuit 960 using the third loop, stop current flow from the high-voltage battery 910 through the conductors of the fifth high-voltage cable. Thus, the third loop may be used to jointly monitor the connections to the fourth high-voltage module 907, the fifth high-voltage module 908, and the sixth high-voltage module 909 in series.

The system 900 may provide advantages over conventional High Voltage Interlock Loop (HVIL) systems. For example, cuts to a cable or other cable damage may be detected as fault conditions using the continuity detection circuit 960 in a loop including shielding of one or more high-voltage cables. For example, the use of additional wiring to high-voltage connectors that attach the high-voltage cables that is typical of traditional HVIL systems may be avoided. For example, the system 900 may enable individual monitoring of load modules (e.g., the first high-voltage module 904) or monitoring of smaller groups of load modules that share a loop with a continuity detection circuit.

As described above, one aspect of the present technology is the gathering and use of data available from various sources to improve a user experience and provide convenience. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to better design future products by arranging components such a high-voltage distribution units or peripheral load modules to optimize performance in larger system (e.g., a vehicle). Thus, the use of some limited personal information may enhance a user experience. Further, other uses for personal information data that benefit the user are also contemplated by the present disclosure.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of vehicle networks, the present technology can be configured to allow users to select to "opt in" or "opt out" of participation in the collection of personal information data during registration for services or anytime thereafter. In another example, users can select not to provide connectivity disruption data. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, connectivity disruption data collection statistics can be determined by inferring preferences based on non-personal information data or a bare minimum amount of personal information, such as averages of past data, other non-personal information available to vehicle computing services, or publicly available information.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures.

What is claimed is:

1. A system comprising:
   a high-voltage power supply;
   a first high-voltage cable including a first conductor connected to the high-voltage power supply and a first shielding that encircles the first conductor;
   a second high-voltage cable including a second conductor connected to the high-voltage power supply and a second shielding that encircles the second conductor;
   a continuity detection circuit connected to the first shielding and to the second shielding, wherein the second shielding is connected to the first shielding to form a conductive loop with the continuity detection circuit;
   a high-voltage distribution unit that houses the high-voltage power supply, wherein the high-voltage distribution unit is attached to a first end of the first high-voltage cable and to a first end of the second high-voltage cable; and
   a load module, wherein the load module is attached to a second end of the first high-voltage cable and to a second end of the second high-voltage cable.

2. The system of claim 1, wherein the high-voltage power supply is part of a vehicle including a chassis that is coupled to a ground node of the continuity detection circuit.

3. The system of claim 1, comprising:
   one or more additional shieldings, of additional high-voltage cables, that are connected in series to form the conductive loop with the continuity detection circuit.

4. The system of claim 1, comprising:
   a high-voltage module connector that attaches the first high-voltage cable and the second high-voltage cable to a load module; and
   a jumper in the high-voltage module connector that connects the first shielding and the second shielding.

5. The system of claim 1,
   wherein the high-voltage distribution unit houses the continuity detection circuit.

6. The system of claim 1,
   wherein the load module that-houses the continuity detection circuit.

7. The system of claim 1, wherein the continuity detection circuit has direct current isolation from a ground node of the high-voltage power supply.

8. The system of claim 1, comprising:
   an alternating current coupling capacitor that couples the first shielding to a ground node.

9. The system of claim 1, comprising:
   a safety circuit configured to, responsive to detection of a disruption of continuity by the continuity detection circuit, stop current flow from the high-voltage power supply through the first conductor.

10. A system comprising:
    a high-voltage power supply;
    a high-voltage cable including a conductor connected to the high-voltage power supply and a shielding that encircles the conductor; and
    a continuity detection circuit connected to the shielding, wherein the high-voltage power supply is part of a vehicle including a chassis that is coupled to a ground node of the continuity detection circuit and the continuity detection circuit is connected to the shielding at a first end of the high-voltage cable and the shielding is coupled to the chassis at a second end of the high-voltage cable, and wherein the continuity detection circuit is configured to drive current through the shielding that returns via the chassis, and wherein the continuity detection circuit has direct current isolation from the chassis and from a ground node of the high-voltage power supply.

11. The system of claim 10, wherein the shielding is coupled to the chassis via an alternating current coupling capacitor in a load module attached to the second end of the high-voltage cable.

12. The system of claim 10, wherein the continuity detection circuit is configured to detect states including an open circuit state and a state indicating a short circuit of the shielding to the chassis.

13. The system of claim 10, wherein the high-voltage cable is a first high-voltage cable, the conductor is a first conductor, and the shielding is a first shielding, comprising:
    a second high-voltage cable including a second conductor connected to the high-voltage power supply and a second shielding that encircles the second conductor, wherein the second shielding is connected in series with the first shielding.

14. The system of claim 10, comprising:
    a high-voltage distribution unit that houses the high-voltage power supply and the continuity detection circuit.

15. The system of claim 10, comprising:
    a high-voltage distribution unit that houses the high-voltage power supply, wherein the high-voltage distribution unit is attached to a first end of the high-voltage cable; and
    a load module that houses the continuity detection circuit, wherein the load module is attached to a second end of the high-voltage cable.

16. The system of claim 10, comprising:
    an alternating current coupling capacitor that couples the shielding to the chassis.

17. The system of claim 10, comprising:
    a safety circuit configured to, responsive to detection of a disruption of continuity by the continuity detection circuit, stop current flow from the high-voltage power supply through the conductor.

18. The system of claim 10, comprising:
a high-voltage distribution unit that houses the high-voltage power supply and the continuity detection circuit.

19. The system of claim 10, comprising:
a high-voltage distribution unit that houses the high-voltage power supply, wherein the high-voltage distribution unit is attached to a first end of the high-voltage cable; and
a load module that houses the continuity detection circuit, wherein the load module is attached to a second end of the high-voltage cable.

* * * * *

UNITED STATES PATENT AND TRADEMARK OFFICE
CERTIFICATE OF CORRECTION

PATENT NO. : 11,784,482 B2
APPLICATION NO. : 17/075231
DATED : October 10, 2023
INVENTOR(S) : Guan Che Ting et al.

It is certified that error appears in the above-identified patent and that said Letters Patent is hereby corrected as shown below:

In the Claims

At Column 27, Claim number 6, Line number 66:
"where the load module that-houses" should be --where the load module houses--.

Signed and Sealed this
Twenty-first Day of November, 2023

Katherine Kelly Vidal
Director of the United States Patent and Trademark Office